(12) United States Patent
Westover et al.

(10) Patent No.: US 11,249,402 B2
(45) Date of Patent: Feb. 15, 2022

(54) ADJUSTABLE RETARDANCE COMPENSATOR FOR SELF-REFERENCING INTERFEROMETER DEVICES

(71) Applicant: ASML Holding N.V., Veldhoven (NL)

(72) Inventors: Ryan Richard Westover, Danbury, CT (US); Ryan Walter Roder, Stamford, CT (US); Peter Ferenz, Norwalk, CT (US); David Taub, Stamford, CT (US)

(73) Assignee: ASML Holding N. V., Veldhoven (NL)

( * ) Notice: Subject to any disclaimer, the term of this patent is extended or adjusted under 35 U.S.C. 154(b) by 0 days.

(21) Appl. No.: 17/231,446

(22) Filed: Apr. 15, 2021

(65) Prior Publication Data

US 2021/0333720 A1 Oct. 28, 2021

Related U.S. Application Data

(60) Provisional application No. 63/014,485, filed on Apr. 23, 2020.

(51) Int. Cl.
*G03F 7/20* (2006.01)
(52) U.S. Cl.
CPC ........ *G03F 7/70825* (2013.01); *G03F 7/7025* (2013.01); *G03F 7/70408* (2013.01); *G03F 7/70775* (2013.01)
(58) Field of Classification Search
CPC .............. G03F 7/70408; G03F 7/7025; G03F 7/70441; G03F 7/70141; G03F 7/70258; G03F 7/70308; G03F 7/70316; G03F 7/708; G03F 7/70808; G03F 7/70816; G03F 7/70825; G03F 7/70833; G03F 7/7095; G03F 7/70966; G03F 7/70975; G03F 7/70983; G02B 5/3083–3091; G02B 27/28–288; G02B 27/62; G02B 7/003–005; G02B 7/18; G02B 7/1822; G02B 7/1824; G02B 7/1825; (Continued)

(56) References Cited

U.S. PATENT DOCUMENTS 4,225,236 A * 9/1980 Sandercock .............. G01J 3/26 356/454
6,297,876 B1 10/2001 Bornebroek
(Continued)

FOREIGN PATENT DOCUMENTS

JP 2001100069 A * 4/2001

*Primary Examiner* — Christina A Riddle
(74) *Attorney, Agent, or Firm* — Sterne, Kessler, Goldstein & Fox P.L.L.C.

(57) ABSTRACT

A compensator for manipulating a radiation beam traveling along an optical path. The compensator includes a fixed support holding a first optical wedge and an adjustable support holding a second optical wedge. The adjustable support includes a base, a stage holding the second optical wedge, first and second flexures, and a drive block. The stage defines a cavity and is movable relative to the base and the fixed support. The first and second flexures couple the stage to the base such that the stage translates along a stage path. The drive block is disposed in the cavity of the stage and is configured to translate along a drive block path perpendicular to the optical path and perpendicular to the stage path. The drive block includes first and second drive bearing surfaces configured to translate the stage in first and second stage directions, respectively, along the stage path.

20 Claims, 12 Drawing Sheets

(58) Field of Classification Search
CPC .... G02B 7/1827; G02B 7/1828; G02B 7/198; G01B 9/02049; G01B 9/02055; G01B 9/02058; G01B 9/02059; G01B 9/02061; G01B 9/02075; G01B 9/02076; G01N 21/21
USPC ............. 355/67–71; 356/399–401, 450–521, 356/614–624; 359/489.2, 694–703, 359/808–819
See application file for complete search history.

(56) References Cited

U.S. PATENT DOCUMENTS

| | | |
|---|---|---|
| 6,961,116 B2 | 11/2005 | Den Boef et al. |
| 7,652,830 B2 * | 1/2010 | Matsui .................. G02B 7/026 359/704 |
| 10,508,906 B2 | 12/2019 | Den Boef et al. |
| 2008/0170232 A1 * | 7/2008 | Buijs ...................... G01J 3/021 356/455 |

* cited by examiner

ADJUSTABLE RETARDANCE COMPENSATOR FOR SELF-REFERENCING INTERFEROMETER DEVICES

CROSS REFERENCE TO RELATED APPLICATIONS

This application claims benefit of U.S. Provisional Patent Application No. 63/014,485, filed on Apr. 23, 2020, which is hereby incorporated herein in its entirety by reference.

FIELD

The present disclosure relates to retardance compensator apparatuses and systems, for example, retardance compensator apparatuses and systems for alignment sensors in lithographic apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (photoresist or, simply, "resist") provided on a substrate.

To project a pattern on a substrate a lithographic apparatus may use electromagnetic radiation. The wavelength of this radiation determines the minimum size of features which can be formed on the substrate. A lithographic apparatus, which uses deep ultraviolet (DUV) radiation, having a wavelength within the range 20-400 nm, for example 193 nm or 248 nm, may be used to form features on a substrate.

An optical retarder changes the polarization of an incident wave through a relative phase shift (e.g., retardance) between two polarization components. However, a retardance value is set when optical components are bonded and path length differences in the optical components cannot be compensated, for example, in alignment sensors.

A retardance compensator or variable retarder is an optical device that is capable of introducing a controllable retardance on an incident wave. Unlike a waveplate whose relative phase shift is fixed, a retardance compensator can vary the phase difference (e.g., retardance) continuously.

However, optical stages holding a retardance compensator are subject to backlash and/or overdriving that can cause errors or damage optics and may be unsuitable for high tolerance applications. Further, appropriate alignment and range of travel of the retardance compensator are critical to ensure continuous retardance adjustment and accurate correction of path length differences in optical assemblies.

SUMMARY

Accordingly, there is a need to compensate for path length differences in optical assemblies with an adjustable, high resolution and large range retardance compensator that provides translational and rotational adjustment with reduced backlash, and dynamically adjusts the effective thickness and resulting retardance with live optical feedback for precise correction.

In some embodiments, a compensator for manipulating a radiation beam traveling along an optical path includes a fixed support holding a first optical wedge and an adjustable support holding a second optical wedge. The adjustable support includes a base, a stage, first and second flexures, and a drive block. The base is coupled to the fixed support. The stage holds the second optical wedge and is movable relative to the base and the fixed support. The stage includes a first stage bearing surface and a second stage bearing surface collectively defining in part a cavity. The first and second flexures movably couple the stage to the base such that the stage translates along a stage path. The drive block is disposed in the cavity. The drive block includes a first drive bearing surface and a second drive bearing surface. The drive block is configured to translate along a drive block path perpendicular to the optical path and perpendicular to the stage path.

In some embodiments, the first drive bearing surface applies a first force to the first stage bearing surface as the drive block translates in a first drive block direction along the drive block path, thereby translating the stage in a first stage direction along the stage path. In some embodiments, the second drive bearing surface applies a second force to the second stage bearing surface as the drive block translates in a second drive block direction, opposite the first drive block direction, along the drive block path, thereby translating the stage in a second stage direction, opposite the first stage direction, along the stage path.

In some embodiments, the adjustable support further includes one of a key and a keyway defining the drive block path. In some embodiments, the drive block further includes the other of the key and the keyway. In some embodiments, an interface between the key and the keyway allows the drive block to translate along the drive block path while preventing rotation of the drive block relative to base. In some embodiments, the adjustable support further includes an arm defining a channel. In some embodiments, the channel forms the keyway. In some embodiments, the drive block further includes a protrusion forming the key that interfaces the keyway.

In some embodiments, the base of the adjustable support defines an opening. In some embodiments, the adjustable support further includes a rod movably disposed through the opening. In some embodiments, the rod is coupled to the drive block such that movement of the rod in the first drive block direction causes the drive block to translate in the first drive block direction, and movement of the rod in the second drive block direction causes the drive block to translate in the second drive block direction.

In some embodiments, the compensator further includes a lock that prevents the stage from moving along the stage path relative to the fixed support. In some embodiments, the lock includes at least one bolt that fastens the stage to the fixed support and at least one bolt that fastens the drive block to the fixed support.

In some embodiments, the fixed support further holds a compensating plate and a half-wave plate. In some embodiments, the adjustable support is configured to space the second optical wedge apart from the first optical wedge, thereby creating an air gap between the first optical wedge and the second optical wedge.

In some embodiments, the fixed support further includes at least one rotational alignment bearing surface. In some embodiments, the adjustable support further includes at least one rotational alignment bearing surface that slidably interfaces with the at least one rotational alignment bearing surface of the adjustable support, thereby constraining any rotation of the adjustable support relative to the fixed support about a center of the optical path. In some embodiments, the at least one rotational alignment bearing surface of the fixed support includes a circumferential guide portion having a radius extending from the center of the optical path.

In some embodiments, the at least one rotational alignment bearing surface of the adjustable support includes an arm extending from the base of the adjustable support. In some embodiments, the compensator further includes a lock configured to prevent relative rotation between the fixed support and the adjustable support. In some embodiments, the lock includes at least one bolt that fastens the adjustable support to the fixed support.

In some embodiments, the compensator further includes a first mechanical stop defining a first terminal position of the stage in the second stage direction along the stage path, and a second mechanical stop defining a second terminal position of the stage in the first stage direction along the stage path. In some embodiments, the first mechanical stop includes an interface between (a) a first shoulder of the base and (b) a first protrusion of the stage, and the second mechanical stop includes an interface between (a) a second shoulder of the base and (b) a second protrusion of the stage. In some embodiments, the compensator further includes a cover coupled to the adjustable support and covering the cavity. In some embodiments, the cover defines a first opening through which the first mechanical stop is visible and a second opening through which the second mechanical stop is visible.

In some embodiments, the stage includes first and second arms and an intermediate body connecting the first and second arms. In some embodiments, the first and second arms extend from opposing ends of the intermediate body of the stage, thereby forming a U-shape. In some embodiments, the cavity is formed in the intermediate body of the stage. In some embodiments, the first flexure is coupled to the base of the adjustable support and to the first arm of the stage. In some embodiments, the second flexure is coupled to the base of the adjustable support and to the second arm of the stage.

In some embodiments, a method of adjusting one or more characteristics of a radiation beam traveling along an optical path includes rotating an adjustable support relative to a fixed support slidably coupled thereto such that rotation of the adjustable support relative to the fixed support rotates a first optical wedge coupled to the adjustable support relative to a second optical wedge coupled to the fixed support about a center of the optical path. In some embodiments, the method further includes translating a drive block along a drive block path in a first drive block direction, thereby translating the first optical wedge relative to the second optical wedge along a stage path in a first stage direction orthogonal to the optical path and the first drive block direction. In some embodiments, the method further includes translating the drive block along the drive block path in a second drive block direction opposite the first drive block direction, thereby translating the first optical wedge relative to the second optical wedge along the stage path in a second stage direction opposite the first stage direction.

In some embodiments, the rotating the adjustable support relative to the fixed support includes sliding a rotational alignment bearing surface of the adjustable support against a circumferential guide portion of the fixed support. In some embodiments, the circumferential guide portion has a radius extending from a center of the optical path.

In some embodiments, the translating the drive block along the drive block path in the first drive block direction includes moving a rod coupled to the drive block in the first drive block direction. In some embodiments, the translating the drive block along the drive block path in the second drive block direction includes moving the rod coupled to the drive block in the second drive block direction. In some embodiments, the rod is threaded. In some embodiments, the moving the rod in the first drive block direction and the second drive block direction includes rotating the rod.

Further features and exemplary aspects of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

Figure 1A:
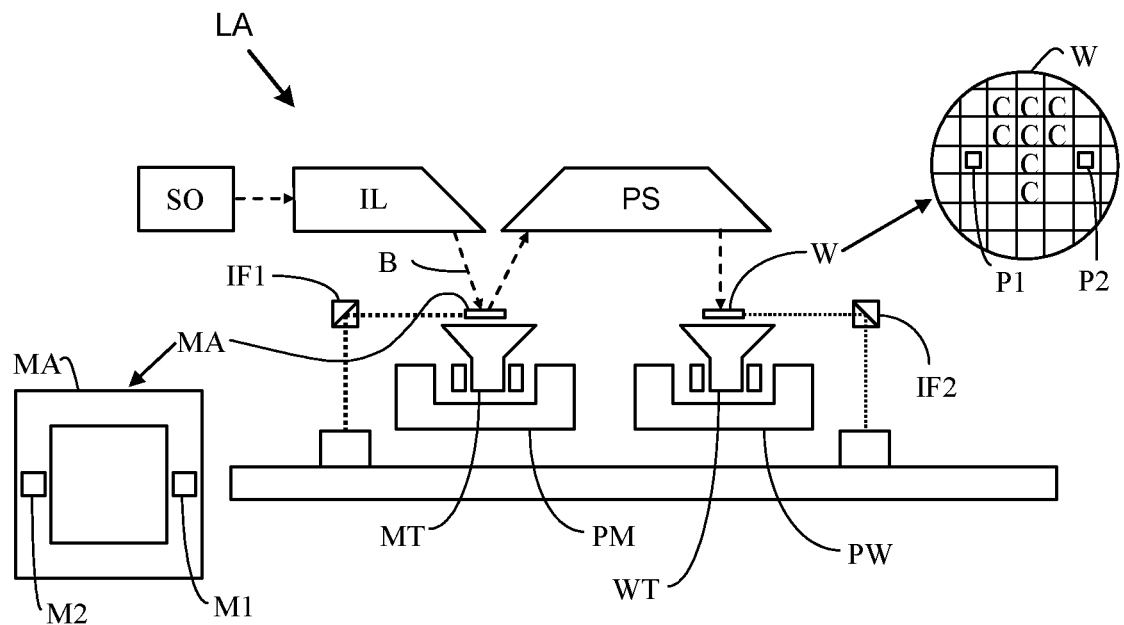
FIG. 1A is a schematic illustration of a reflective lithographic apparatus, according to an exemplary embodiment.

The features and exemplary aspects of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this present invention. The disclosed embodiment(s) merely exemplify the present invention. The scope of the invention is not limited to the disclosed embodiment(s). The present invention is defined by the claims appended hereto.

The embodiment(s) described, and references in the specification to "one embodiment," "an embodiment," "an example embodiment," "an exemplary embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

Figure 1B:
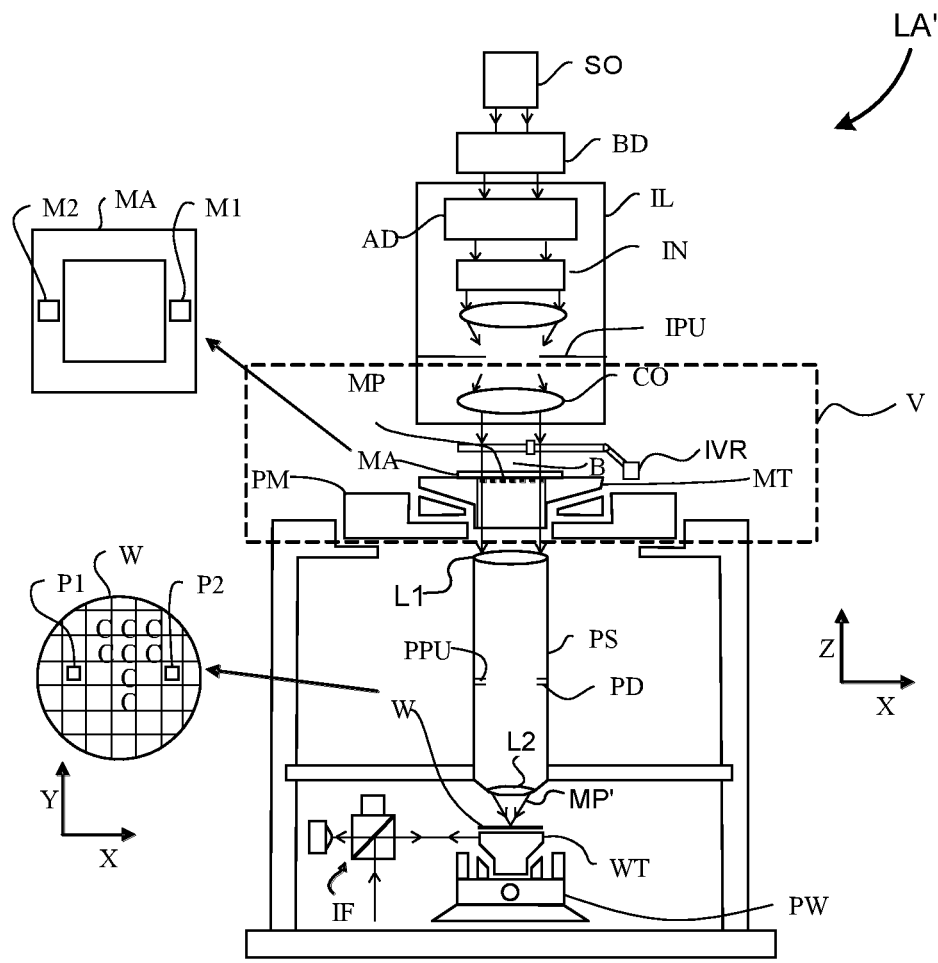
FIG. 1B is a schematic illustration of a transmissive lithographic apparatus, according to an exemplary embodiment.

FIGS. 1A and 1B are schematic illustrations of a lithographic apparatus LA and lithographic apparatus LA', respectively, in which embodiments of the present invention may be implemented. Lithographic apparatus LA and lithographic apparatus LA' each include the following: an illumination system (illuminator) IL configured to condition a radiation beam B (for example, deep ultraviolet (DUV) radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a photoresist coated wafer) W and connected to a second positioner PW configured to accurately position the substrate W. Lithographic apparatus LA and LA' also have a projection system PS configured to project a pattern imparted to the radiation beam B by patterning device MA onto a target portion (for example, comprising one or more dies) C of the substrate W. In lithographic apparatus LA, the patterning device MA and the projection system PS are reflective. In lithographic apparatus LA', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus LA and LA', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus LA' of FIG. 1B) or reflective (as in lithographic apparatus LA of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for DUV or electron beam radiation since other gases can absorb too much radiation or electrons. A vacuum environment can therefore be provided to the whole beam path with the aid of a vacuum wall and vacuum pumps.

Lithographic apparatus LA and/or lithographic apparatus LA' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus LA, LA' can be separate physical entities, for example, when the source SO is an excimer laser. In such cases, the source SO is not considered to form part of the lithographic apparatus LA or LA', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus LA, LA', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus LA, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of an upper lens or upper lens group L1 and a lower lens or lower lens group L2, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image MP' of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. For example, the illumination at the illumination system pupil IPU may use only two opposite illumination quadrants, sometimes referred to as BMW illumination, such that the remaining two quadrants are not used in the illumination but are configured to capture first-order diffracted beams. Further, in some embodiments, astigmatism aberration may be reduced by blocking the zeroth order beams in the pupil conjugate PPU of the projection system associated with radiation poles in opposite quadrants.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus LA and LA' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus LA includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source. A lithographic apparatus, which uses EUV radiation, having a wavelength within the range 4-20 nm, for example 6.7 nm or 13.5 nm, may be used to form smaller features on a substrate than a lithographic apparatus which uses, for example, radiation with a wavelength of 193 nm.

A relative vacuum, i.e. a small amount of gas (e.g. hydrogen) at a pressure well below atmospheric pressure, may be provided in the radiation source SO, in the illumination system IL, and/or in the projection system PS. The radiation source SO may be a laser produced plasma (LPP) source, a discharge produced plasma (DPP) source, a free electron laser (FEL), an excimer laser, a master oscillator power amplifier (MOPA), a master oscillator power ring amplifier (MOPRA), or any other radiation source that is capable of generating DUV and/or EUV radiation.

Exemplary Adjustable Retardance Compensator Apparatus

As discussed above, an optical retarder changes the polarization of an incident wave through a controlled relative phase shift (e.g., retardance) between two polarization components. A retarder can be a waveplate that introduces a relative phase shift ($\Delta\varphi$), for example, a full-wave plate (e.g., $\Delta\varphi=2\pi$), a half-wave plate (e.g., $\Delta\varphi=\pi$), or a quarter-wave plate (e.g., $\Delta\phi=\pi/2$). However, a retardance value is set when optical components are bonded and path length differences in the optical components cannot be compensated, for example, in alignment sensors (e.g., self-referencing interferometer (SRI) system, dual self-referencing interferometer (DSRI) system) for lithographic apparatuses and systems, for example, lithographic apparatus LA, LA'.

Alignment sensors can include interferometric alignment sensors, for example, a SMASH™ (SMart Alignment Sensor Hybrid) sensor, as described in U.S. Pat. No. 6,961,116 that employs a self-referencing interferometer (SRI) with a single detector and four different wavelengths, an ATHENA™ (Advanced Technology using High order ENhancement of Alignment) sensor, as described in U.S. Pat. No. 6,297,876, and an ORION™ sensor, as described in U.S. Pat. No. 10,508,906, which are hereby incorporated by reference herein in their entireties.

Optical interference corresponds to the interaction of two or more light waves yielding a resultant irradiance that deviates from the sum of the component irradiances. If two beams are to interfere to produce a stable pattern, they must have nearly the same frequency (i.e., coherent beams). Interferometry is a field of study based on the superposition of waves or beams to cause interference in order to extract information. An interferometer is a tool or device that combines two or more sources of light to create an interference pattern which can be measured and analyzed. Generally, light from a single source is split into two beams (i.e., coherent beams) that travel in different optical paths and are later combined again to produce an interference pattern. Amplitude-splitting interferometers use a partial reflector to divide the amplitude of the incident wave into separate beams which are later recombined.

A self-referencing interferometer (SRI) system creates an interference pattern by combining an aberrated beam with a reference beam created by filtering a sample of the aberrated beam. For example, an SRI system can be a plurality of prisms combined to effectively provide two images of an alignment target, rotate one image 180° with respect to the other, and interferometrically recombine the images. Similar to an SRI system, a dual self-referencing interferometer (DSRI) system combines two prism assemblies into a single system. For example, two prism assemblies can be combined on a common optic (e.g., plate), along a beamsplitter interface, into adjacent prisms (e.g., side by side), or into a rectangular beamsplitter prism with prism assemblies on the faces of the rectangular beamsplitter prism to form a DSRI system.

A prism is a wedge shaped transparent optical element that separates electromagnetic (EM) radiation based on refraction due to a difference in refractive indices. Generally, a prism has a flat, polished surface. The cross-section of a prism is a polygon, and the sides of the prism are antiparallel. A prism can include a plurality of surfaces and the angles between surfaces of a prism can vary, but there must be an angle between at least two surfaces. A beam-splitting prism is a type of reflective prism configured to split a beam into two or more beams. A polarizing prism is a type of prism configured to split a beam into varying polarization components based on non-linear optics. Non-linear optics (NLO) involves EM radiation in non-linear media, meaning a polarization of the media (i.e., electric dipole moment) interacts non-linearly with the electric field of the EM radiation. The normal linear relationship between an electric field and the dielectric field breaks down in non-linear media. The non-linear interaction can manifest itself as a change in polarization, frequency, phase, and/or beam path.

A non-linear prismatic optic can have non-linear refractive index changes. For example, a birefringent material has a refractive index that depends on the polarization and propagation direction of the EM radiation. The birefringent non-linear media causes double refraction, wherein unpolarized EM radiation is split into two beam paths of parallel and perpendicular polarization. The birefringent non-linear media consists of two polarization wave components corresponding to different refractive indices (e.g., no and ne). The ordinary ray (o-ray) has polarization in a direction perpendicular to the optical axis, while the extraordinary ray (e-ray), which does not follow Snell's law, has polarization in a direction of the optical axis of the medium.

A retardance compensator or variable retarder is an optical device that is capable of introducing a controllable retardance on an incident wave, for example, utilized in an SRI system or a DSRI system. Unlike a waveplate (e.g., a fixed retarder) whose relative phase shift ($\Delta\varphi$) is fixed, a retardance compensator can vary the phase difference continuously (e.g., capable of changing the phase difference within a certain range). A retardance compensator can include one or more birefringent plates (e.g., wedges) that form an adjustable waveplate, for example, a Babinet compensator (e.g., two thin wedges), a Soleil compensator (e.g., two wedges and one plane-parallel plate), or a Berek compensator (e.g., rotatable uniaxial plate).

However, optical stages holding a retardance compensator are subject to backlash (e.g., sloshing) and/or overdriving that can cause errors or damage optics (e.g., SRI components, DSRI components) and may be unsuitable for high tolerance applications (e.g., lithographic alignment). Further, appropriate alignment and range of travel of the retardance compensator are critical to ensure continuous retardance adjustment (e.g., capable of changing the retardance within a certain range) and accurate correction of path length differences in optical assemblies.

Embodiments of adjustable retardance compensator apparatuses and systems as discussed below may compensate for path length differences in optical assemblies (e.g., interferometric alignment sensor, an SRI system, a DSRI system) with an adjustable, high resolution (e.g., 2 μm translation, 150 gad rotation) and large range (e.g., ±1.5 mm translational freedom, 2 degrees of rotational freedom) retardance compensator that provides translational and rotational adjustment with reduced backlash (e.g., sloshing), and dynamically adjusts the effective thickness and resulting retardance with live optical feedback for precise correction, for example, in an alignment sensor (e.g., SMASH™ sensor, ATHENA™ sensor, ORION™ sensor) for a lithographic apparatus.

Figure 2:
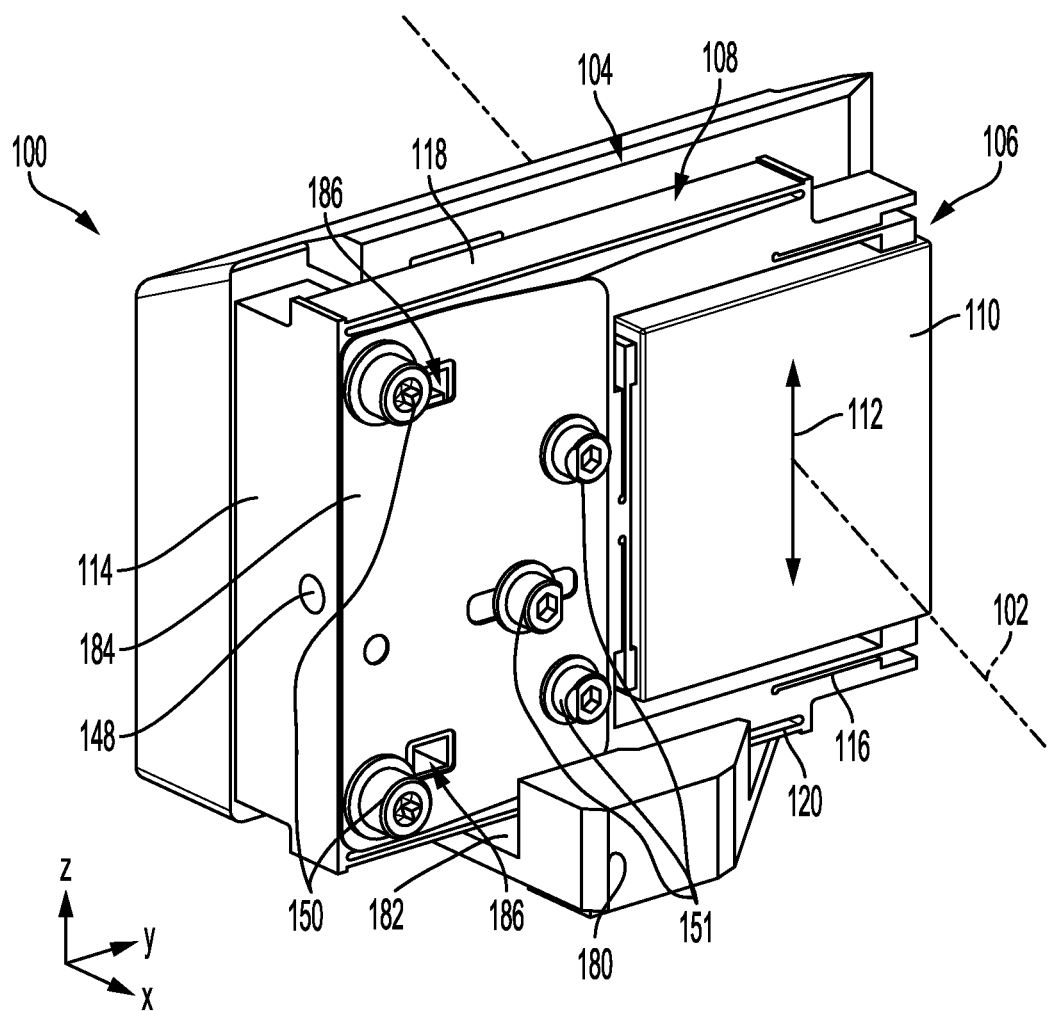
FIG. 2 is a schematic front perspective illustration of a compensator, according to an exemplary embodiment.
Figure 13:
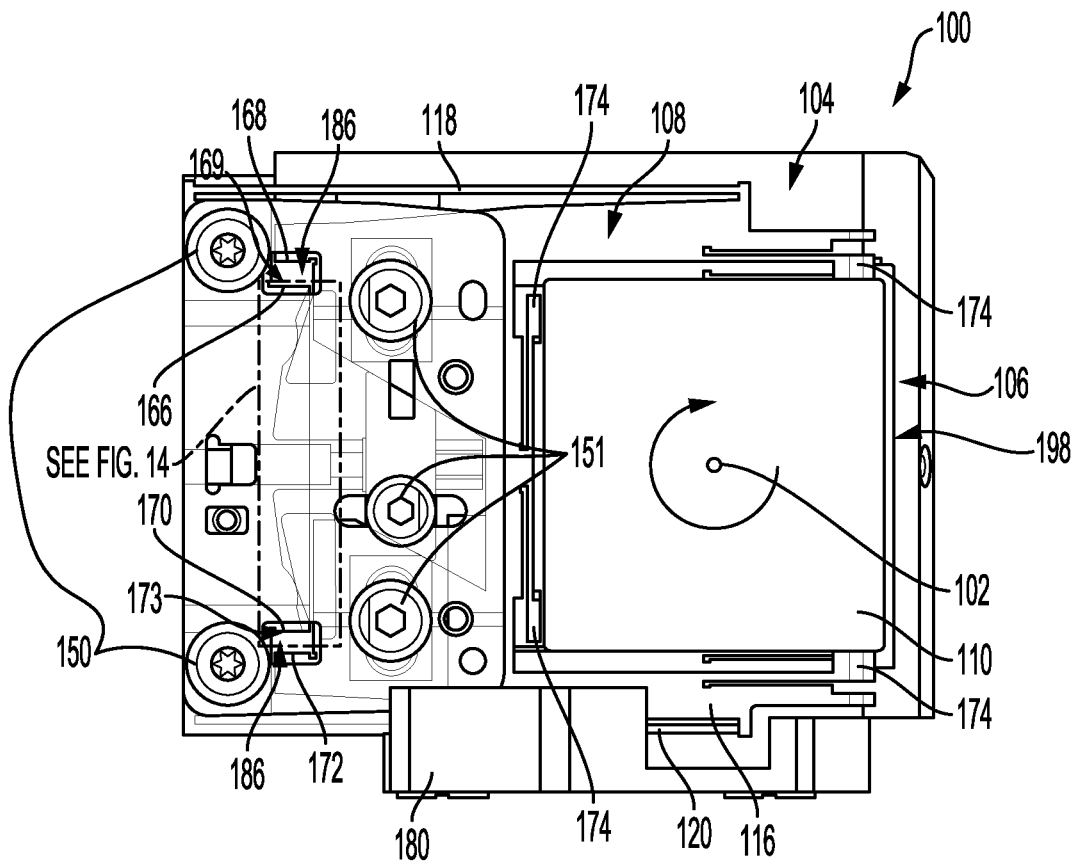
FIG. 13 is a schematic front illustration of the compensator shown in FIG. 2, according to an exemplary embodiment.
Figure 14:
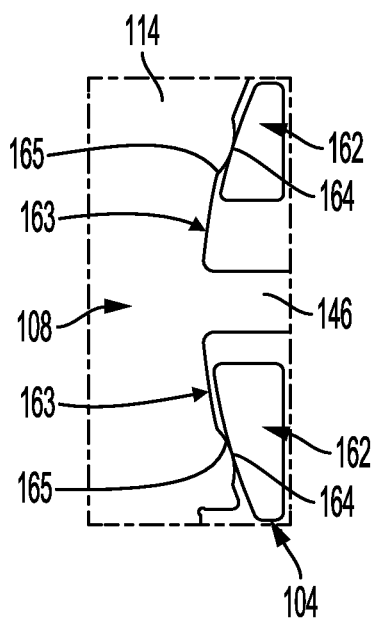
FIG. 14 is a schematic front breakout illustration of the compensator shown in FIG. 13, according to an exemplary embodiment.

FIGS. 2, 13, and 14 illustrate compensator 100, according to various exemplary embodiments. FIG. 2 is a schematic front perspective illustration of compensator 100, according to an exemplary embodiment. FIG. 13 is a schematic front illustration of compensator 100 shown in FIG. 2, according to an exemplary embodiment. FIG. 14 is a schematic front breakout illustration of compensator 100 shown in FIG. 13, according to an exemplary embodiment.

Compensator 100 can be configured to manipulate a radiation beam (e.g., adjusting one or more characteristics of the radiation beam) traveling along optical path 102 by dynamically adjusting a relative phase shift (e.g., retardance) between two polarization components to compensate for path length differences, for example, in an optical assembly. Compensator 100 can be further configured to provide a high resolution and a large range by translational and/or rotational adjustment with reduced backlash (e.g., sloshing) and precise continuous linear motion. In some embodiments, compensator 100 can provide a translation resolution of about 0.1 μm to about 10 μm, a rotation resolution of about 1 μrad to about 300 μrad, a translation range of about ±0.1 mm to about ±3.0 mm, and a rotation range of about 0.1 degrees to about 5 degrees. For example, compensator 100 can provide a translation resolution of 2 μm, a rotation resolution of 150 μrad, a translation range of ±1.5 mm, and a rotation range of 2 degrees. Compensator 100 can be further configured to dynamically adjust the effective thickness and resulting retardance (e.g., first and second optical wedges 154, 110) with live optical feedback for precise correction, for example, by measuring a combined birefringence (e.g., nm/cm) and/or path length difference (e.g., nm) between first and second optical wedges 154, 110 and/or an optical assembly (e.g., alignment system 1500).

Figure 15:
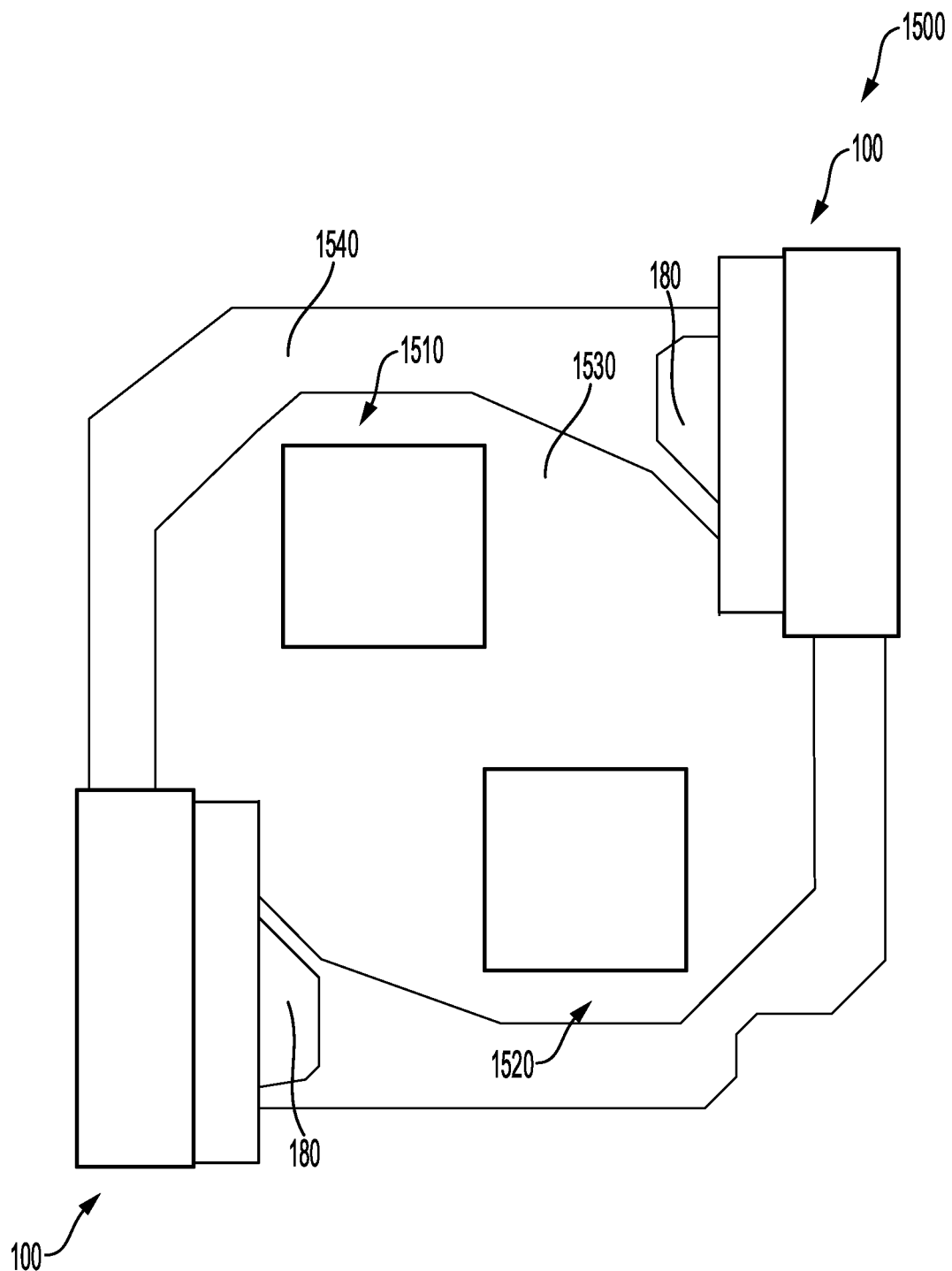
FIG. 15 is a schematic plan view illustration of an alignment system with two compensators, according to an exemplary embodiment.

Although compensator 100 is shown in FIGS. 2 and 13 as a stand-alone apparatus and/or system, the embodiments of this disclosure can be used with other optical systems, such as, but not limited to, lithographic apparatus LA, LA', alignment system 1500, and/or other optical systems. In some embodiments, compensator 100 can be part of an alignment sensor in lithographic apparatus LA, LA'. For example, as shown in FIG. 15, compensator 100 can be part of an alignment sensor (e.g., alignment system 1500), for example, an interferometric alignment sensor (e.g., an SRI system, a DSRI system) and compensate for path length differences in an optical assembly (e.g., SRI components, DSRI components).

As shown in FIG. 2, compensator 100 can include fixed support 104 and adjustable support 108. Adjustable support 108 can be coupled to fixed support 104. In some embodiments, a portion of adjustable support 108 can contact a portion of fixed support 104. For example, as shown in FIGS. 13 and 14, base 114 of adjustable support 108 can contact circumferential guide portion 164 of rotational alignment bearing surface 162 of fixed support 104 to ensure smooth and controlled relative rotation between adjustable support 108 and fixed support 104. In some embodiments, adjustable support 108 can be coupled to fixed support 104 by one or more bolts 150. For example, as shown in FIG. 2, one or more bolts 150 (e.g., threaded) can extend through adjustable support 108 and connect to fixed support 104 (e.g., threaded holes 152) to secure adjustable support 108 to fixed support 104. In some embodiments, a portion of adjustable support 108 can move relative to fixed support 104. For example, stage 116 of adjustable support 108 can move relative to fixed support 104.

As shown in FIGS. 2 and 13, compensator 100 can include second optical wedge 110 and first optic 106 through which optical path 102 traverses. Fixed support 104 supports first optic 106 and adjustable support 108 supports second optical wedge 110, which will be described in further detail below. Second optical wedge 110 can be supported by first and second flexures 118, 120 of adjustable support 108, which will be described in further detail below. Compensator 100 can include cover 184 coupled to adjustable support 108. For example, as shown in FIG. 2, cover 184 can be secured to adjustable support 108 via one or more bolts 150 and include first and second openings 186, which will be described in further detail below. Compensator 100 can include guide plate 180 of fixed support 104, which will be described in further detail below.

In some embodiments, compensator 100 can be attached to a common assembly (e.g., a plate or platform) of an alignment sensor. For example, as shown in FIG. 15, compensator 100 (e.g., guide plate 180) can be attached to common plate 1540 supporting an adjacent interferometric alignment sensor, for example, first alignment optic 1510 (e.g., an SRI system). In some embodiments, one or more compensators 100 can be attached to a common assembly (e.g., plate) of an alignment sensor. For example, as shown in FIG. 15, two compensators 100 (e.g., guide plates 180) can be attached to common plate 1540 supporting an adjacent interferometric alignment sensor, for example, first and second alignment optics 1510, 1520 (e.g., a DSRI system).

Exemplary Fixed Supports

Figure 5:
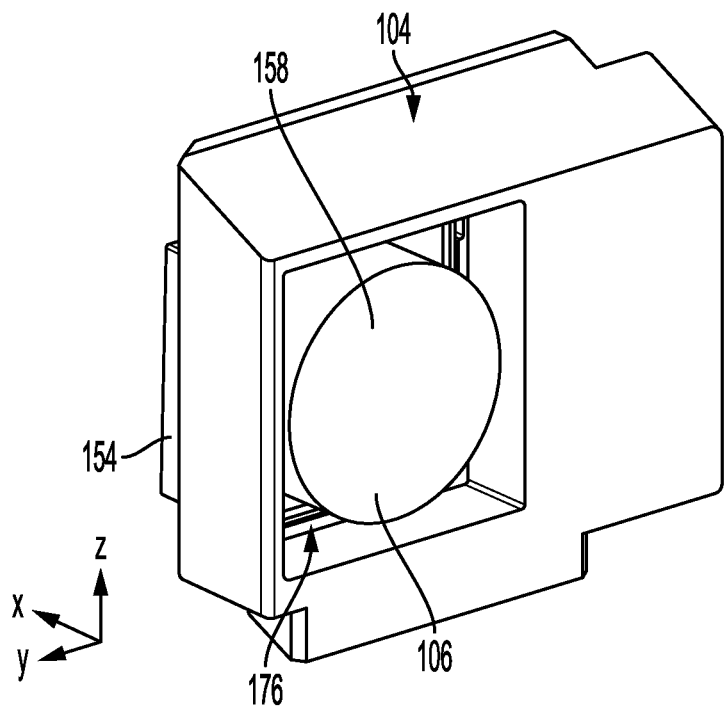
FIG. 5 is a schematic back perspective illustration of a fixed support of the compensator shown in FIG. 2, according to an exemplary embodiment.
Figure 6:
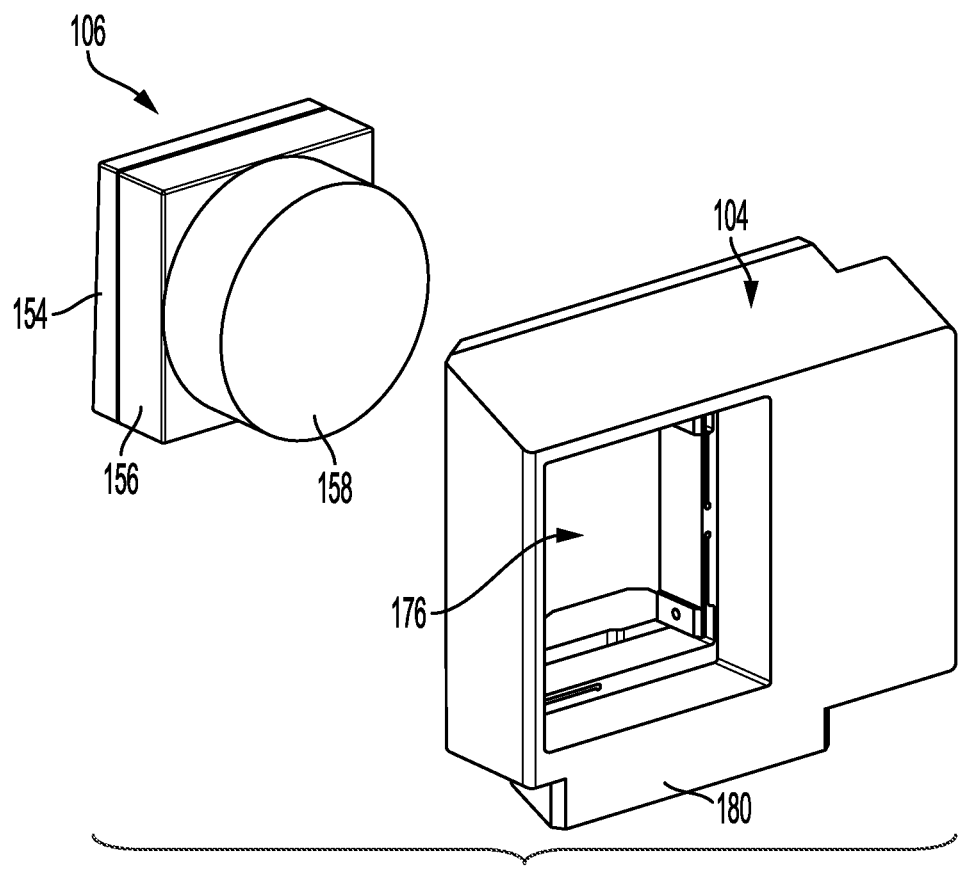
FIG. 6 is a schematic back exploded perspective illustration of the fixed support shown in FIG. 5, according to an exemplary embodiment.
Figure 12:
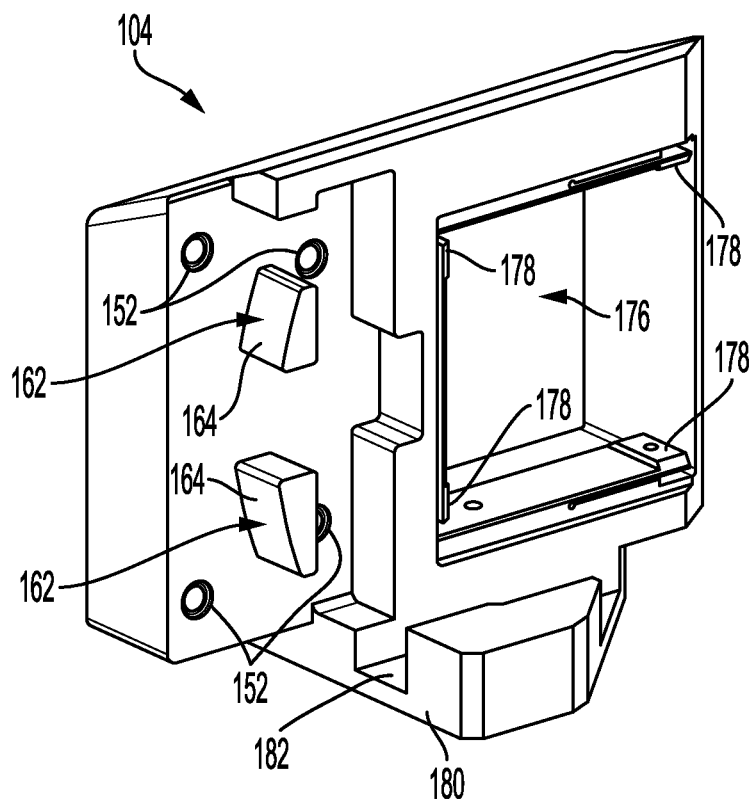
FIG. 12 is a schematic front perspective illustration of the fixed support shown in FIGS. 5 and 6, according to an exemplary embodiment.

FIGS. 5, 6, and 12 illustrate fixed support 104 of compensator 100, according to various exemplary embodiments. FIG. 5 is a schematic back perspective illustration of fixed support 104 of compensator 100 shown in FIG. 2, according to an exemplary embodiment. FIG. 6 is a schematic back exploded perspective illustration of fixed support 104 shown in FIG. 5, according to an exemplary embodiment. FIG. 12 is a schematic front perspective illustration of fixed support 104 shown in FIGS. 5 and 6, according to an exemplary embodiment.

As shown in FIG. 5, fixed support 104 can be configured to hold first optic 106. For example, first optic 106 can be bonded to fixed support 104. Fixed support 104 can be coupled to base 114 of adjustable support 108. For example, fixed support 104 can include one or more threaded holes 152 and one or more bolts 150 can contact threaded holes 152 to selectively and fixedly secure base 114 of adjustable support 108 to fixed support 104. Fixed support 104 can include rotational alignment bearing surfaces 162, guide plate 180, through-hole 176, and first optic 106. In some embodiments, fixed support 104 can include a metal, a ceramic, and/or any other rigid machinable material.

Figure 11:
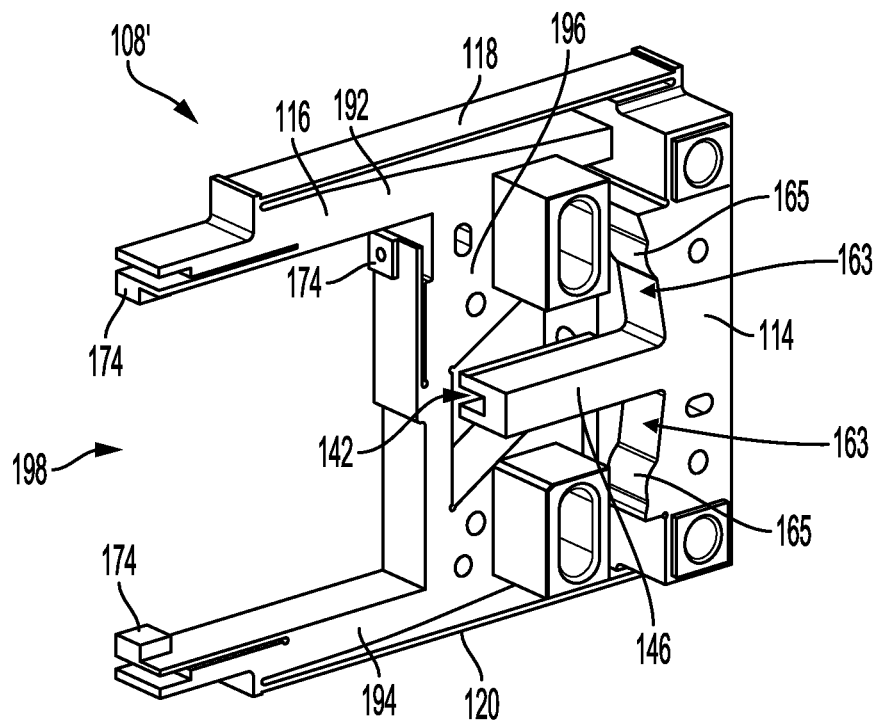
FIG. 11 is a schematic back perspective illustration of the adjustable support shown in FIG. 7, according to an exemplary embodiment.

Rotational alignment bearing surfaces 162 can be configured to constrain any rotation of adjustable support 108 relative to fixed support 104, for example, about a center of optical path 102. As shown in FIGS. 12 and 14, each rotational alignment bearing surface 162 can include circumferential guide portion 164. Circumferential guide portion 164 can have a radius extending from the center of optical path 102. In some embodiments, base 114 can contact fixed support 104. For example, as shown in FIGS. 11 and 12, circumferential guide portions 165 of base 114 can contact rotational alignment bearing surfaces 162 of fixed support 104. In some embodiments, rotational alignment bearing surfaces 162 can be formed with little or no burrs such that circumferential guide portions 164 have a low surface roughness. For example, rotational alignment bearing surfaces 162 can include chamfers to reduce burrs and/or can be formed by milling (e.g., wire electrical discharge machining (EDM)).

Guide plate 180 can be configured to support a portion of adjustable support 108. As shown in FIG. 12, guide plate 180 can include groove 182 configured to receive and support adjustable support 108, for example, second flexure 120. Guide plate 180 can be further configured to integrate with a common plate (e.g., common plate 1540 shown in FIG. 15) supporting an adjacent interferometric alignment sensor, for example, an SRI system or a DSRI system (e.g., first and second alignment optics 1510, 1520 shown in FIG. 15). In some embodiments, a respective guide plate 180 of two compensators 100 can be attached to a common plate supporting an adjacent interferometric alignment sensor, for example, an SRI system or a DSRI system. For example, guide plate 180 of each compensator 100 can include one or more through-holes configured to receive one or more bolts to secure guide plate 180 to common plate 1540.

Through-hole 176 can be configured to receive first optic 106 and transmit the incident beam. Through-hole 176 can include first optic contact pads 178. For example, as shown in FIG. 12, one or more first optic contact pads 178 can be formed in fixed support 104 around the circumference of through-hole 176. First optic contact pads 178 can be configured to secure first optic 106 (e.g., compensating plate 156). For example, first optic 106 (e.g., compensating plate 156) can be bonded to first optic contact pads 178.

First optic 106 can be configured to polarize an incident wave and form part of a retardance compensator to introduce a controlled relative phase shift (e.g., retardance) in the incident wave. As best seen in FIG. 6, first optic 106 can include first optical wedge 154, compensating plate 156, and half-wave plate 158. First optical wedge 154 can be bonded to compensating plate 156, and compensating plate 156 can be bonded to half-wave plate 158 to form an integrated optical assembly (e.g., first optic 106). First optic 106 can be bonded to fixed support 104. For example, as shown in FIG. 5, first optic 106 (e.g., compensating plate 156) can be bonded to first optic contact pads 178 of through-hole 176. First optical wedge 154 can be configured to form a first optical assembly (e.g., a Babinet compensator) with second optical wedge 110. Compensating plate 156 can be configured to act as a second optical assembly (e.g., a Soleil compensator) in combination with first and second optical wedges 154, 110. Half-wave plate 158 can be configured to introduce a relative phase shift (e.g., $\Delta\varphi=\pi$) in the incident wave.

First optic 106 can be aligned along optical path 102 and combined with second optical wedge 110 of adjustable support 108 to form a retardance compensator (e.g., compensator 100). For example, first optical wedge 154 and second optical wedge 110 can act as a first optical assembly having a first thickness (e.g., $t_1$), the total thickness of both wedges along optical path 102, and compensating plate 156 can act as a second optical assembly having a second thickness (e.g., $t_2$) along optical path 102, such that the retardance (e.g., relative phase shift) is defined as $\Delta\varphi=(2\pi/\lambda)(t_1-t_2)(|n_o-n_e|)$, where $\lambda$ is the wavelength of the incident wave, no is the index of refraction of the ordinary ray, and no is the index of refraction of the extraordinary ray. In some embodiments, first optic 106 and second optical wedge 110 can form a Soleil compensator (e.g., two wedges and one plane-parallel plate).

Exemplary Adjustable Supports

Figure 3:
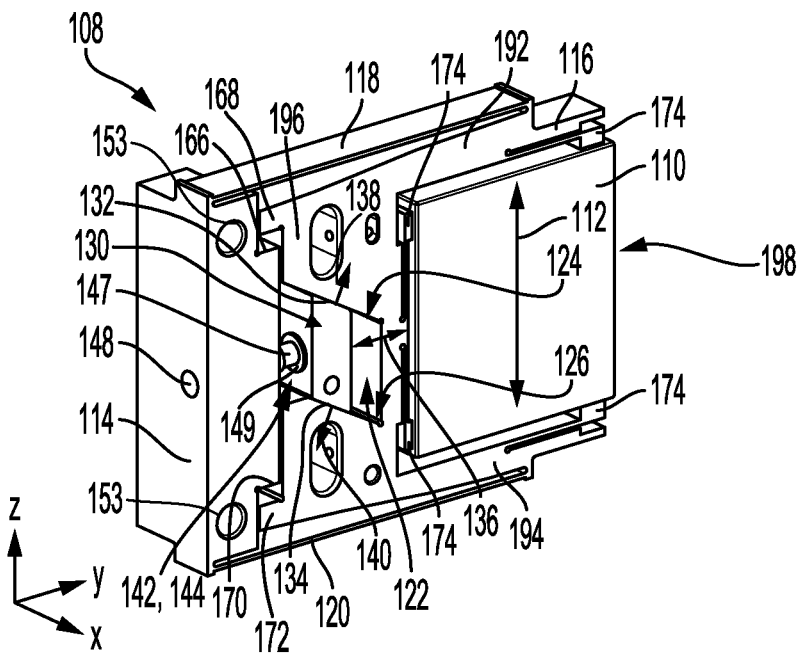
FIG. 3 is a schematic front perspective illustration of an adjustable support of the compensator shown in FIG. 2, according to an exemplary embodiment.

FIGS. 3, 4, 7, 11, and 14 illustrate adjustable support 108, 108' of compensator 100, according to various exemplary embodiments. FIG. 3 is a schematic front perspective illustration of adjustable support 108 of compensator 100 shown in FIG. 2, according to an exemplary embodiment.

As shown in FIG. 3, adjustable support 108 can be configured to hold second optic 110, for example, second optical wedge 110, and move relative to fixed support 104. For example, second optical wedge 110 can be bonded to stage 116 of adjustable support 108. Base 114 of adjustable support 108 can be coupled to fixed support 104. For example, one or more bolts 150 can extend through adjustable support 108 and contact one or more threaded holes 152 of fixed support 104 to fixedly secure base 114 of adjustable support 108 to fixed support 104. Adjustable support 108 can include second optical wedge 110, base 114, stage 116, first and second flexures 118, 120, and drive block 130. In some embodiments, adjustable support 108 can include a metal, a ceramic, and/or any other rigid machinable material.

Second optical wedge 110 can be configured to form part of a retardance compensator to introduce a controlled relative phase shift (e.g., retardance) in the incident wave. For example, second optical wedge 110 can form a first optical assembly (e.g., a Babinet compensator) with first optic 106, including for example, first optical wedge 154. Second optical wedge 110 can be bonded to adjustable support 108. For example, as shown in FIG. 3, second optical wedge 110 can be bonded to second optical wedge contact pads 174 of through-hole 198 of stage 116. Second optical wedge 110 can be aligned along optical path 102 and combined with first optic 106 of fixed support 104 to form a retardance compensator (e.g., compensator 100).

Figure 10A:
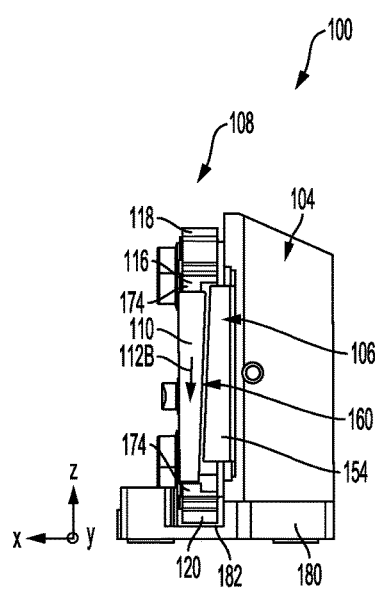
FIGS. 10A-10C are schematic side illustrations of the compensator shown in FIGS. 9A-9C, respectively, according to exemplary embodiments.
Figure 10B:
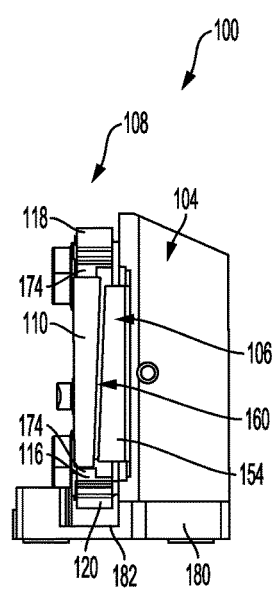
Figure 10C:
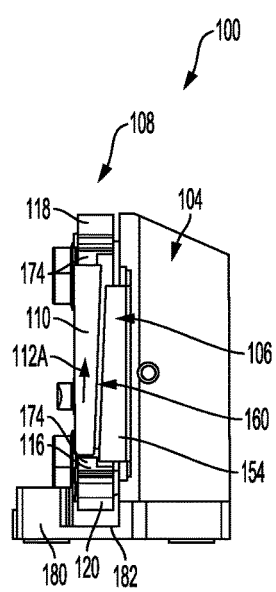

In some embodiments, second optical wedge 110 and first optic 106 (including, e.g., first optical wedge 154) can be separated spatially from one another by air gap 160. For example, as shown in FIGS. 10A-10C, compensator 100 can include air gap 160 disposed between first and second optical wedges 154, 110. Air gap 160 can be configured to reduce optical interference of the incident wave and can provide a minimum air gap between first and second optical wedges 154, 110, for example, an air gap of at least 0.3 mm. In some embodiments, adjustable support 108 can be configured to space second optical wedge 110 apart from first optical wedge 154 to create air gap 160 between first and second optical wedges 154, 110. For example, air gap 160 can be at least 0.3 mm.

Base 114 can be configured to couple adjustable support 108 to fixed support 104. For example, one or more bolts 150 can extend through one or more through-holes 153 of base 114 to contact one or more bolts 150 to threaded holes 152 to selectively and fixedly secure base 114 of adjustable support 108 to fixed support 104. As shown in FIGS. 3, 8B, 11, and 14, base 114 can include rotational alignment bearing surfaces 163, arm 146, opening 148, and first and second shoulders 166, 170. Base 114 can be coupled to stage 116 via at least first and second flexures 118, 120. For example, as shown in FIG. 3, upper and lower portions of base 114 can be connected to a first distal end of first and second flexures 118, 120, respectively, and a second distal end, opposite the first distal end, of first and second flexures 118, 120 can be connected to stage 116, for example, first and second arms 192, 194.

Rotational alignment bearing surfaces 163 can be configured to constrain any rotation of adjustable support 108 relative to fixed support 104, for example, about a center of optical path 102. As shown in FIGS. 11 and 14, each rotational alignment bearing surface 163 can include circumferential guide portion 165. Rotational alignment bearing surfaces 163 can have a radius extending from the center of optical path 102. In some embodiments, base 114 can contact fixed support 104. For example, as shown in FIGS. 11 and 14, circumferential guide portions 165 of base 114 can contact rotational alignment bearing surfaces 162 of fixed support 104. In some embodiments, rotational alignment bearing surfaces 163 can be formed with little or no burrs such that circumferential guide portions 165 have a low surface roughness. For example, rotational alignment bearing surfaces 163 can include chamfers to reduce burrs and/or can be formed by milling (e.g., wire electrical discharge machining (EDM)). In some embodiments, rotational alignment bearing surfaces 163 can include arm 146. For example, as shown in FIGS. 11 and 14, at least one rotational alignment bearing surface 163 can include arm 146 extending from base 114 toward through-hole 198 of stage 116. In some embodiments, base 114 can include arm 146. For example, as shown in FIGS. 11 and 14, arm 146 can extend from base 114 toward through-hole 198 of stage 116 and be positioned between rotational alignment bearing surfaces 163.

In some embodiments, adjustable support 108 can include arm 146 configured to prevent rotation of drive block 130 and define drive block path 136. For example, arm 146 can be configured to translate drive block 130 along drive block path 136 while preventing rotation of drive block 130 relative to base 114. Arm 146 can be configured to define keyway 142 to interface with key 144 of drive block 130. In some embodiments, arm 146 can be a protrusion extending from base 114 towards through-hole 198 of stage 116. For example, as shown in FIG. 11, arm 146 can be a cuboid. Keyway 142 can be configured to define drive block path 136, for example, first and second drive block directions 136A, 136B. In some embodiments, keyway 142 can be disposed and/or formed in arm 146. For example, as shown in FIG. 11, keyway 142 can be a slot, a channel, or a trench in arm 146, for example, along a longitudinal axis of arm 146. In some embodiments, keyway 142 can be configured such that motion of rod 147 does not drive a linear motion of stage 116 along stage path 112. For example, linear motion of stage 116 along stage path 112 (e.g., first and second stage directions 112A, 112B) can be controlled by key 144 on drive block 130 and keyway 142 on base 114. In some embodiments, an interface (e.g., coupling, matching, interlocking) between keyway 142 and key 144 can translate drive block 130 along drive block path 136 while preventing rotation of drive block 130 relative to base 114. In some embodiments, the orientation of keyway 142 and key 144 can be reversed. For example, arm 146 can include key 144 and drive block 130 can include keyway 142.

Figure 4:
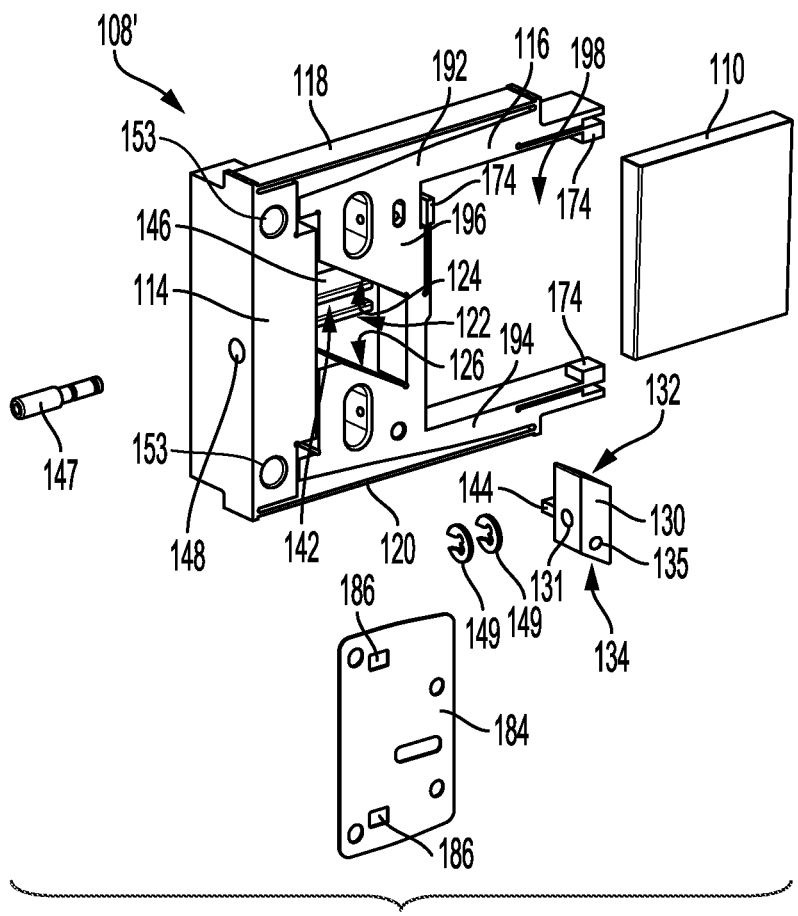
FIG. 4 is a schematic front exploded perspective illustration of an adjustable support, according to an exemplary embodiment.
Figures 8A, 8B, 8C:
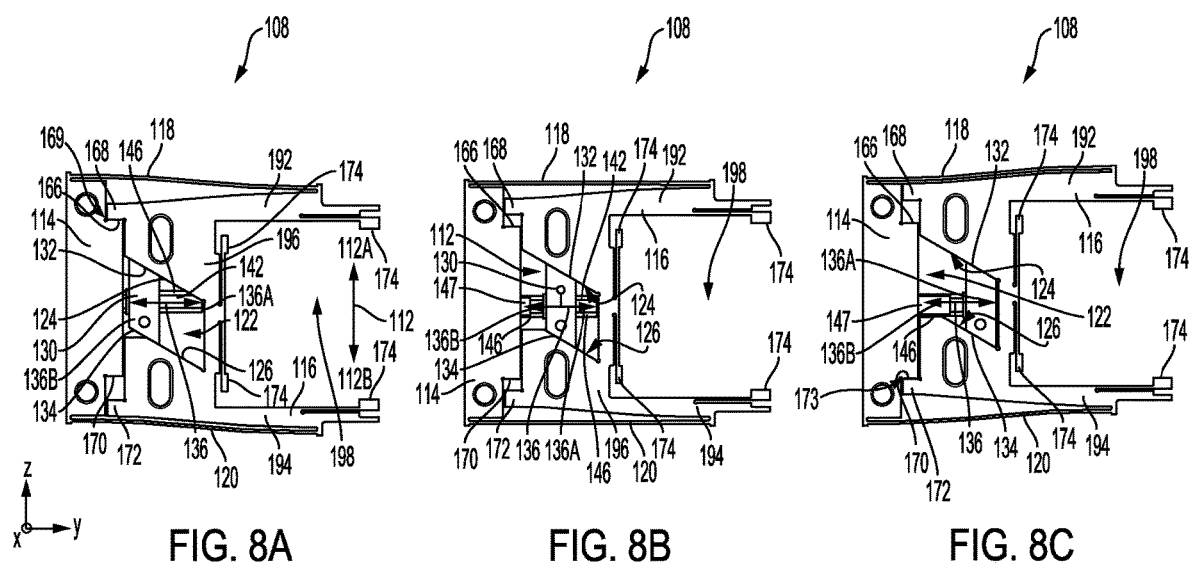
FIGS. 8A-8C are schematic front illustrations of an adjustable support with a stage translated along a vertical (Z-axis) direction, according to exemplary embodiments.
Figure 9A:
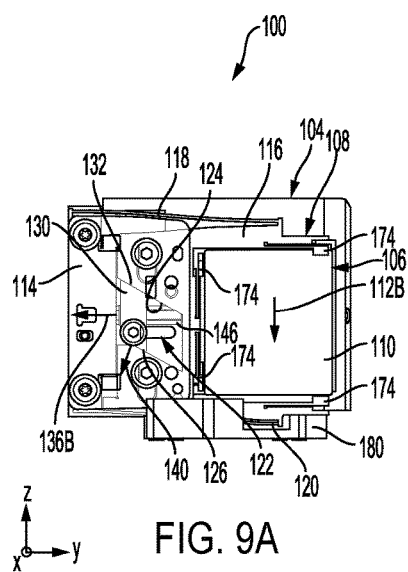
FIGS. 9A-9C are schematic front illustrations of a compensator with the adjustable support shown in FIGS. 8A-8C, respectively, translated along a vertical (Z-axis) direction, according to exemplary embodiments.
Figure 9B:
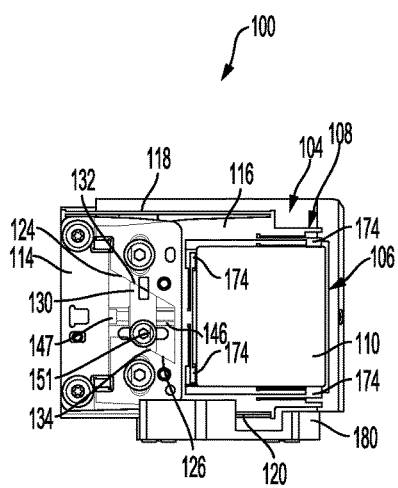
Figure 9C:
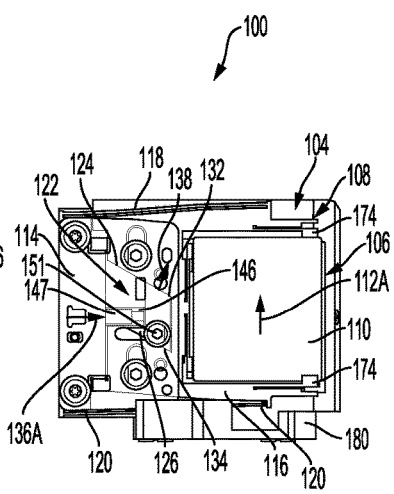

Opening 148 can be configured to receive rod 147 to operatively couple to drive block 130. For example, as shown in FIGS. 3 and 4, opening 148 in base 114 can be a through-hole and rod 147 can be inserted into opening 148 and contact drive block 130 (e.g., at rod contact 131). In some embodiments, rod 147 can be any geometric shape capable of mating with opening 148 and drive block 130. For example, as shown in FIG. 4, rod 147 can be cylindrical with recesses for locking washers 149. In some embodiments, as shown in FIGS. 8C and 9C, rod 147 can be coupled to drive block 130 (e.g., rod contact 131 and locking washers 149) such that movement of rod 147 in first drive block direction 136A causes drive block 130 to translate in first drive block direction 136A. In some embodiments, as shown in FIGS. 8A and 9A, rod 147 can be coupled to drive block 130 (e.g., rod contact 131 and locking washers 149) such that movement of rod 147 in second drive block direction 136B causes drive block 130 to translate in second drive block direction 136B.

In some embodiments, adjustable support 108 can include first and second mechanical stops 169, 173 that define the translational range motion of stage 116. For example, first and second shoulders 166, 170 of base 114 can be configured to interact with first and second protrusions 168, 172, respectively, of stage 116. For example, first and second shoulders 166, 170 can include a notch or a protrusion extending from base 114 towards through-hole 198 of stage 116. In some embodiments, first and second shoulders 166, 170 can interact with first and second protrusions 168, 172, respectively, to form first and second mechanical stops 169, 173, respectively. For example, as shown in FIG. 8A, first mechanical stop 169 can include an interface between first shoulder 166 of base 114 and first protrusion 168 of stage 116. For example, as shown in FIG. CA, second mechanical stop 173 can include an interface between second shoulder 170 of base 114 and second protrusion 172 of stage 116.

First and second mechanical stops 169, 173 can be configured to prevent overdriving of stage 116 and/or to reduce damage to adjacent optical components (e.g., an SRI system, a DSRI system). In some embodiments, first mechanical stop 169 can define a first terminal position of stage 116 in second stage direction 112B along stage path 112. For example, as shown in FIGS. 8A and 9A, first mechanical stop 169 can limit a lower vertical position (e.g., Z-axis) of second flexure 120 of stage 116 along second stage direction 112B. In some embodiments, second mechanical stop 173 can define a second terminal position of stage 116 in first stage direction 112A along stage path 112. For example, as shown in FIGS. 8C and 9C, second mechanical stop 173 can limit an upper vertical position (e.g., Z-axis) of first flexure 118 of stage 116 along first stage direction 112A. In some embodiments, cover 184 coupled to adjustable support 108 can include first and second openings 186 through which first and second mechanical stops 169, 173 can be visible. For example, as shown in FIGS. 2 and 13, first and second mechanical stops 169, 173 can be seen through first and second openings 186 of cover 184.

Stage 116 can be configured to hold second optical wedge 110 and move relative to base 114 and fixed support 104. As shown in FIG. 3, stage 116 can include cavity 122, first stage bearing surface 124, second stage bearing surface 126, first arm 192, second arm 194, intermediate body 196, and through-hole 198. Cavity 122 can be configured to receive drive block 130 and link linear motion (e.g., horizontal, Y-axis) along keyway 142 to linear motion (e.g., vertical, Z-axis) of stage 116. First and second stage bearing surfaces 124, 126 can define cavity 122 for drive block 130. In some embodiments, cavity 122 can be disposed in intermediate body 196. For example, as shown in FIG. 3, cavity 122 can be disposed in intermediate body 196 between base 114 and through-hole 198.

Figure 7:
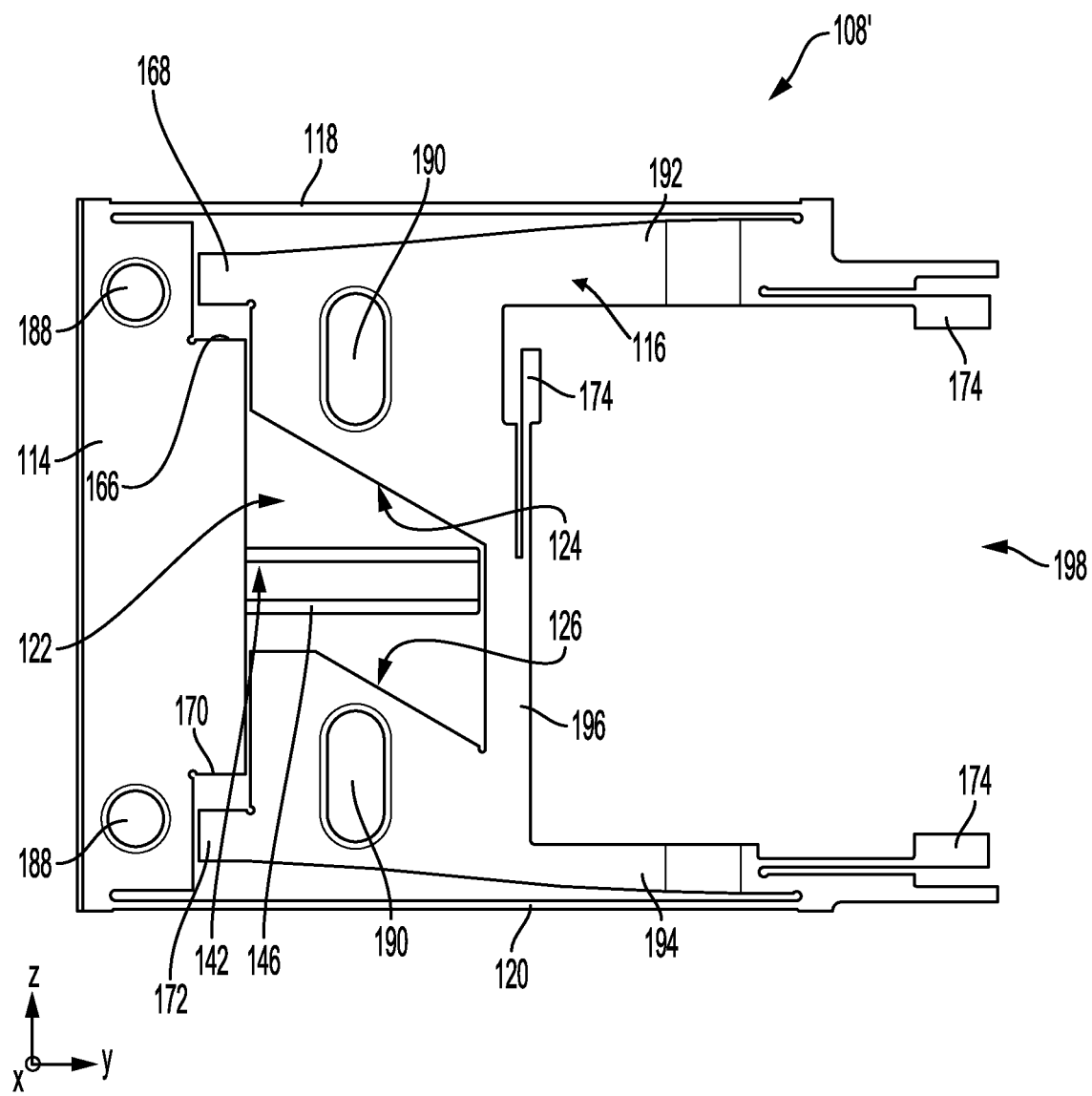
FIG. 7 is a schematic front illustration of the adjustable support shown in FIG. 4, according to an exemplary embodiment.

First and second arms 192, 194 are configured to couple to first and second flexures 118, 120, respectively, and hold second optical wedge 110. For example, first and second arms 192, 194 can each include second optic contact pad 174 that can be bonded to second optical wedge 110. Intermediate body 196 can connect to first and second arms 192, 194. For example, as shown in FIGS. 3 and 7, first and second arms 192, 194 can extend from intermediate body 196 from opposing ends to form a U-shape.

Through-hole 198 can be configured to receive second optical wedge 110 and transmit the incident beam. Through-hole 198 can include second optic contact pads 174. In some embodiments, one or more second optic contact pads 174 can be formed in stage 116 around the circumference of through-hole 198. For example, as shown in FIG. 8B, four second optic contact pads 174 can be formed in stage 116, one in first arm 192, one in second arm 194, and two in intermediate body 196. For example, as shown in FIG. 7, three second optic contact pads 174 can be formed in stage 116, one in first arm 192, one in second arm 194, and one in intermediate body 196. Second optic contact pads 174 can be configured to secure second optical wedge 110. For example, second optical wedge 110 can be bonded to second optic contact pads 174.

First and second flexures 118, 120 can be configured to provide linear motion along stage path 112 (e.g., Z-axis) and move stage 116 relative to base 114 and fixed support 104. For example, as shown in FIGS. 3 and 7, first flexure 118 can be coupled to base 114 and first arm 192, and second flexure 120 can be coupled to base 114 and second arm 194. As shown in FIG. 7, first and second flexures 118, 120 can provide a double-bladed flexure that can reduce deviations from pure linear motion (e.g., along Z-axis).

Drive block 130 can be configured to translate along drive block path 136 perpendicular to optical path 102 and perpendicular to stage path 112. Drive block 130 can be further configured to continuously adjust stage 116 relative to base 114 and fixed support 104 along stage path 112, in both directions (e.g., first and second stage directions 112A, 112B), with reduced backlash (e.g., sloshing). Drive block 130 can be further configured to define a range and a resolution of compensator 100. For example, an angle of drive block 130 (e.g., first and second drive bearing surfaces 132, 134 relative to drive block path 136 or Y-axis) and/or cavity 122 (e.g., first and second stage bearing surfaces 124, 126 relative to drive block path 136 or Y-axis) can be changed such that the range is decreased and the resolution is increased (e.g., decrease angle), or the range is increased and the resolution is decreased (e.g., increase angle). For example, a ratio of horizontal movement (e.g., Y-axis) along drive block path 136 to vertical movement (e.g., Z-axis)

along stage path 112 can be changed based on an angle of drive block 130 and/or cavity 122 relative to the Y-axis (e.g., 1:1, 2:1, 5:1, 10:1, 1:2, 1:5, 1:10, etc.).

As shown in FIG. 4, drive block 130 can include rod contact 131, key 144, first drive bearing surface 132, second drive bearing surface 134, and threaded lock 135. In some embodiments, drive block 130 can be a prism. For example, as shown in FIGS. 3 and 4, drive block 130 can be a parallelepiped (e.g., a rhombohedron). In some embodiments, upper (e.g., first drive bearing surface 132) and lower (e.g., second drive bearing surface 134) faces of drive block 130 can be parallel. In some embodiments, upper (e.g., first drive bearing surface 132) and lower (e.g., second drive bearing surface 134) faces of drive block 130 can be nonparallel. In some embodiments, drive block 130 can include a metal, a ceramic, and/or any other rigid machinable material.

Rod contact 131 can be coupled to rod 147 such that movement of rod 147 in first drive block direction 136A causes drive block 130 to translate in first drive block direction 136A, and movement of rod 147 in second drive block direction 136B causes drive block 130 to translate in second drive block direction 136B. As shown in FIG. 4, rod contact 131 can include a recess into a face of drive block 130, the face being perpendicular to drive block path 136 (e.g., along Y-axis).

Key 144 of drive block 130 and keyway 142 of base 114 are configured to define drive block path 136. Key 144 interfaces with keyway 142 and allows drive block 130 to translate along drive block path 136 while preventing rotation of drive block 130 relative to base 114. As shown in FIG. 4, key 144 can protrude out from drive block 130 orthogonal to first and second drive bearing surfaces 132, 134 (e.g., along X-axis).

First drive bearing surface 132 can be configured to apply first force 138 to first stage bearing surface 124 of intermediate body 196 as drive block 130 translates in first drive block direction 136A along drive block path 136. For example, as shown in FIGS. 8C and 9C, stage 116 can translate in first stage direction 112A along stage path 112 when first force 138 is applied to first stage bearing surface 124. Second drive bearing surface 134 can be configured to apply second force 140 to second stage bearing surface 126 of intermediate body 196 as drive block 130 translates in second drive block direction 136B along drive block path 136. For example, as shown in FIGS. 8A and 9A, stage 116 can translate in second stage direction 112B, opposite first stage direction 112A, along stage path 112 when second force 140 is applied to second stage bearing surface 126.

In some embodiments, compensator 100 can include lock 151 configured to prevent relative rotation between fixed support 104 and adjustable support 108. For example, as shown in FIGS. 2 and 13, lock 151 can include at least one bolt that fastens adjustable support 108 to fixed support 104. In some embodiments, compensator 100 can include lock 151 configured to prevent stage 116 from moving along stage path 112 relative to fixed support 104. For example, as shown in FIGS. 2 and 13, lock 151 can include at least one bolt (e.g., bolt 151) that fastens stage 116 to fixed support 104 (e.g., threaded hole 152) and at least one bolt (e.g., bolt 151) that fastens drive block 130 to fixed support 104 (e.g., threaded lock 135).

FIG. 4 is a schematic front exploded perspective illustration of adjustable support 108', according to an exemplary embodiment. FIG. 7 is a schematic front illustration of adjustable support 108' shown in FIG. 4, according to an exemplary embodiment. FIG. 11 is a schematic back perspective illustration of adjustable support 108' shown in FIG. 7, according to an exemplary embodiment.

FIGS. 4, 7, and 11 illustrate adjustable support 108', according to exemplary embodiments. The embodiments of adjustable support 108 shown in FIG. 3 and the embodiments of adjustable support 108' shown in FIGS. 4, 7, and 11 may be similar. Similar reference numbers are used to indicate similar features of the embodiments of adjustable support 108 shown in FIG. 3 and the similar features of the embodiments of adjustable support 108' shown in FIGS. 4, 7, and 11. One difference between the embodiments of adjustable support 108 shown in FIG. 3 and the embodiments of adjustable support 108' shown in FIGS. 4, 7, and 11 is that adjustable support 108' includes three second optic contact pads 174, rather than four second optic contact pads 174 shown in FIG. 3.

As shown in FIG. 7, an exemplary aspect of adjustable support 108' is three second optic contact pads 174 to contact and secure second optical wedge 110. For example, as shown in FIG. 7, intermediate body 196 only includes one second optic contact pad 174 extending horizontally (Y-axis) away from stage 116 toward second optical wedge 110.

Exemplary Compensator Apparatus Adjustments

FIGS. 8A-8C, 9A-9C, and 10A-10C illustrate translation of stage 116 of adjustable support 108 of compensator 100 along a vertical (Z-axis) direction, according to various exemplary embodiments.

FIGS. 8A-8C are schematic front illustrations of adjustable support 108 with stage 116 translated along a vertical (e.g., Z-axis) direction, according to exemplary embodiments. FIGS. 9A-9C are schematic front illustrations of compensator 100 with adjustable support 108 shown in FIGS. 8A-8C, respectively, translated along a vertical (e.g., Z-axis) direction, according to exemplary embodiments. FIGS. 10A-10C are schematic side illustrations of compensator 100 shown in FIGS. 9A-9C, respectively, according to exemplary embodiments.

As shown in FIGS. 8B, 9B, and 10B, compensator 100 is in a neutral or zeroed position, for example, with second optical wedge 110 and first optic 106 coincident along optical path 102. Thus, a center of second optical wedge 110 and a center of first optical wedge 154 are coincident and pass through optical path 102.

As shown in FIGS. 8C, 9C, and 10C, rod 147 can translate drive block 130 along first drive block direction 136A via key 144 and keyway 142. As drive block 130 translates horizontally (e.g., Y-axis) along keyway 142 in first drive block direction 136A, first force 138 is applied by first drive bearing surface 132 of drive block 130 to first stage bearing surface 124 of intermediate body 196, which flexes first flexure 118 in a vertical linear motion (e.g., Z-axis) along first stage direction 112A. Due to the angle of drive block 130 (e.g., angle between first drive bearing surface 132 and drive block path 136), each horizontal linear motion (e.g., Y-axis) of drive block 130 along keyway 142 transfers, by a proportionality factor (e.g., 1:1, 1:2, 2:1, etc.), to vertical linear motion (e.g., Z-axis) of stage 116 and second optical wedge 110 along first stage direction 112A relative to fixed support 104, base 114, and first optic 106.

As shown in FIGS. 8A, 9A, and 10A, rod 147 can translate drive block 130 along second drive block direction 136B via key 144 and keyway 142. As drive block 130 translates horizontally (e.g., Y-axis) along keyway 142 in second drive block direction 136B, second force 140 is applied by second drive bearing surface 134 of drive block 130 to second stage bearing surface 126 of intermediate body 196, which flexes second flexure 120 in a vertical linear motion (e.g., Z-axis) along second stage direction 112B. Due to the angle of drive block 130 (e.g., angle between second drive bearing surface 134 and drive block path 136), each horizontal linear motion (e.g., Y-axis) of drive block 130 along keyway 142 transfers, by a proportionality factor (e.g., 1:1, 1:2, 2:1, etc.), to vertical linear motion (e.g., Z-axis) of stage 116 and second optical wedge 110 along second stage direction 112B relative to fixed support 104, base 114, and first optic 106.

Exemplary Alignment System

FIG. 15 illustrates alignment system 1500, according to exemplary embodiments. Alignment system 1500 can be configured to measure, for example, an alignment mark and dynamically compensate for path length differences in optical components (e.g., first alignment optic 1510, second alignment optic 1520) in alignment system 1500. In some embodiments, alignment system 1500 can be an interferometric alignment sensor (e.g., an SRI system, a DSRI system) for, but not limited to, lithographic apparatus LA, LA', and/or other optical systems. As shown in FIG. 15, alignment system 1500 can include one or more compensators 100, first alignment optic 1510, second alignment optic 1520, alignment optic plate 1530, and/or common plate 1540. First alignment optic 1510 can be optically coupled to first compensator 100, and second alignment optic 1520 can be optically coupled to second compensator 100. First and/or second compensator 100 can be configured to compensate for path length differences between first and/or second alignment optics 1510, 1520 (e.g., an SRI system, a DSRI system).

In some embodiments, first and second alignment optics 1510, 1520 can be an interferometric optical assembly (e.g., a DSRI system). In some embodiments, first and second alignment optics 1510, 1520 can be disposed on alignment optic plate 1530. In some embodiments, alignment optic plate 1530 and one or more compensators 100 with guide plates 180 can be disposed on common plate 1540.

Exemplary Flow Diagram

Figure 16:
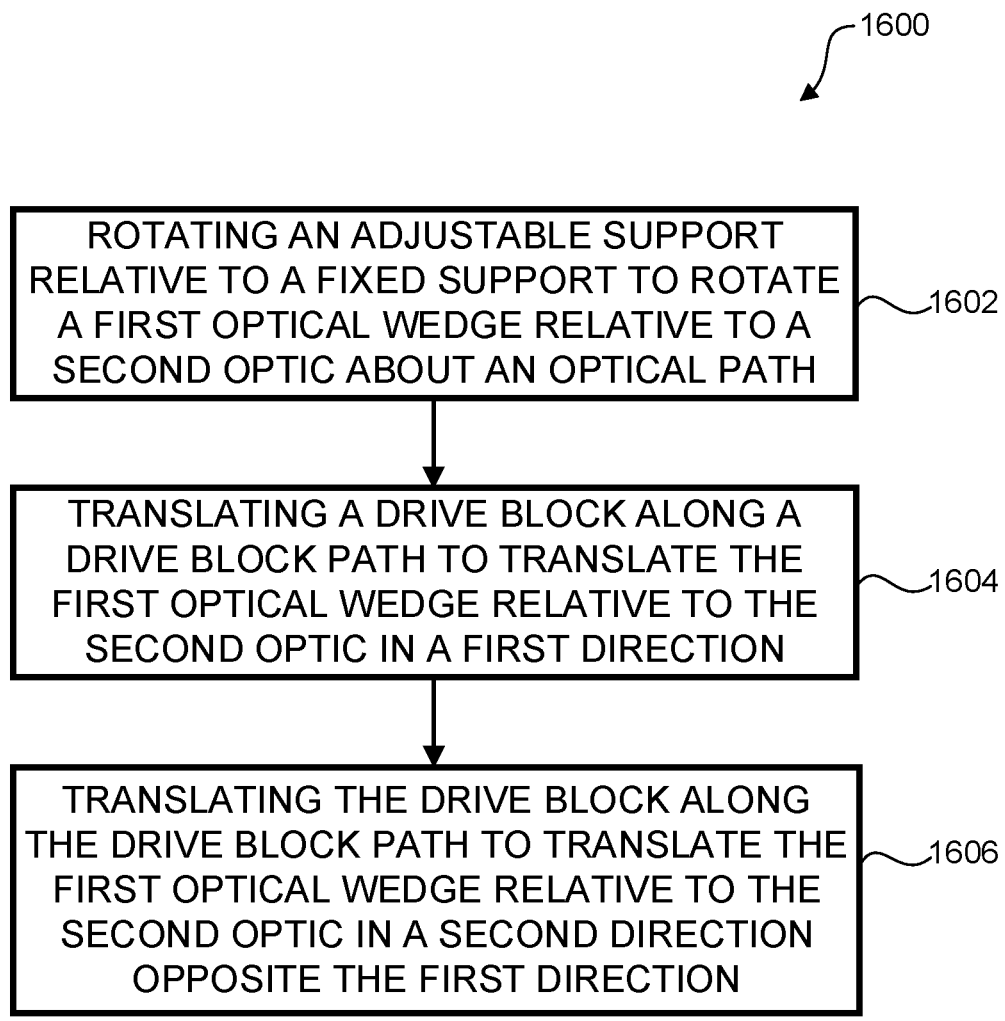
FIG. 16 illustrates a flow diagram for adjusting a radiation beam traveling along an optical path, according to an exemplary embodiment.

FIG. 16 illustrates flow diagram 1600 for adjusting one or more characteristics of a radiation beam traveling along optical path 102, according to an embodiment. It is to be appreciated that not all steps in FIG. 16 are needed to perform the disclosure provided herein. Further, some of the steps may be performed simultaneously, sequentially, and/or in a different order than shown in FIG. 16. Flow diagram 1600 shall be described with reference to FIGS. 9A-9C, 10A-10C, 13, and 14. However, flow diagram 1600 is not limited to those example embodiments.

In step 1602, as shown in the example of FIGS. 13 and 14, second optical wedge 110 coupled to adjustable support 108 can be rotated relative to first optic 106 coupled to fixed support 104, for example, about a center of optical path 102. In some embodiments, first optic 106 can include first optical wedge 154 such that first and second optical wedges 154, 110 can rotate relative to another. In some embodiments, adjustable support 108 can be slidably coupled to fixed support 104 such that rotation of adjustable support 108 relative to fixed support 104 rotates second optical wedge 110 relative to first optic 106. In some embodiments, rotating adjustable support 108 relative to fixed support 104 can include sliding rotational alignment bearing surface 163 of adjustable support 108 against circumferential guide portion 164 of fixed support 104. For example, circumferential guide portion 164 can have a radius extending from a center of optical path 102.

In step 1604, as shown in the example of FIGS. 9A and 10A, drive block 130 can be translated along drive block path 136 in first drive block direction 136A such that second optical wedge 110 can be translated relative to first optical wedge 154 along stage path 112 in first stage direction 112A perpendicular to optical path 102 and first drive block direction 136A. In some embodiments, translating drive block 130 along drive block path 136 in first drive block direction 136A can include moving rod 147 coupled to drive block 130 in first drive block direction 136A. In some embodiments, rod 147 can be threaded. In some embodiments, moving rod 147 in first drive block direction 136A can include rotating rod 147.

In step 1606, as shown in the example of FIGS. 9C and 10C, drive block 130 can be translated along drive block path 136 in second drive block direction 136B opposite first drive block direction 136A such that second optical wedge 110 can be translated relative to first optical wedge 154 along stage path 112 in second stage direction 112B opposite first stage direction 112A. In some embodiments, translating drive block 130 along drive block path 136 in second drive block direction 136B can include moving rod 147 coupled to drive block 130 in second drive block direction 136B. In some embodiments, rod 147 can be threaded. In some embodiments, moving rod 147 in second drive block direction 136B can include rotating rod 147.

The embodiments may further be described using the following clauses:

1. A compensator for manipulating a radiation beam traveling along an optical path, the compensator comprising:
a fixed support holding a first optical wedge; and
an adjustable support comprising:
a base coupled to the fixed support;
a stage holding a second optical wedge, the stage being movable relative to the base and the fixed support, and the stage having a first stage bearing surface and a second stage bearing surface collectively defining in part a cavity;
first and second flexures movably coupling the stage to the base such that the stage translates along a stage path; and
a drive block disposed in the cavity, the drive block having a first drive bearing surface and a second drive bearing surface, and the drive block being configured to translate along a drive block path perpendicular to the optical path and perpendicular to the stage path,
wherein the first drive bearing surface applies a first force to the first stage bearing surface as the drive block translates in a first drive block direction along the drive block path, thereby translating the stage in a first stage direction along the stage path, and
wherein the second drive bearing surface applies a second force to the second stage bearing surface as the drive block translates in a second drive block direction, opposite the first drive block direction, along the drive block path, thereby translating the stage in a second stage direction, opposite the first stage direction, along the stage path.

2. The compensator of clause 1, wherein:
the adjustable support further comprises one of a key and a keyway defining the drive block path;
the drive block further comprises the other of the key and the keyway; and
an interface between the key and the keyway allows the drive block to translate along the drive block path while preventing rotation of the drive block relative to base.

3. The compensator of clause 2, wherein:
the adjustable support further comprises an arm defining a channel;
the channel forms the keyway; and
the drive block further comprises a protrusion forming the key that interfaces the keyway.

4. The compensator of clause 1, wherein:
  the base of the adjustable support defines an opening; and
  the adjustable support further comprises a rod movably disposed through the opening, the rod is coupled to the drive block such that movement of the rod in the first drive block direction causes the drive block to translate in the first drive block direction, and movement of the rod in the second drive block direction causes the drive block to translate in the second drive block direction.
5. The compensator of clause 1, further comprising a lock that prevents the stage from moving along the stage path relative to the fixed support.
6. The compensator of clause 5, wherein the lock comprises at least one bolt that fastens the stage to the fixed support and at least one bolt that fastens the drive block to the fixed support.
7. The compensator of clause 1, wherein the fixed support further holds a compensating plate and a half-wave plate.
8. The compensator of clause 1, wherein the adjustable support is configured to space the second optical wedge apart from the first optical wedge, thereby creating an air gap between the first optical wedge and the second optical wedge.
9. The compensator of clause 1, wherein:
  the fixed support further comprises at least one rotational alignment bearing surface; and
  the adjustable support further comprises at least one rotational alignment bearing surface that slidably interfaces with the at least one rotational alignment bearing surface of the fixed support, thereby constraining any rotation of the adjustable support relative to the fixed support about a center of the optical path.
10. The compensator of clause 9, wherein:
  the at least one rotational alignment bearing surface of the fixed support comprises a circumferential guide portion having a radius extending from the center of the optical path; and
  the at least one rotational alignment bearing surface of the adjustable support comprises an arm extending from the base of the adjustable support.
11. The compensator of clause 9, further comprising a lock configured to prevent relative rotation between the fixed support and the adjustable support.
12. The compensator of clause 11, wherein the lock comprises at least one bolt that fastens the adjustable support to the fixed support.
13. The compensator of clause 1, further comprising:
  a first mechanical stop defining a first terminal position of the stage in the second stage direction along the stage path; and
  a second mechanical stop defining a second terminal position of the stage in the first stage direction along the stage path.
14. The compensator of clause 13, wherein:
  the first mechanical stop comprises an interface between (a) a first shoulder of the base and (b) a first protrusion of the stage; and
  the second mechanical stop comprises an interface between (a) a second shoulder of the base and (b) a second protrusion of the stage.
15. The compensator of clause 13, further comprising a cover coupled to the adjustable support and covering the cavity, wherein the cover defines a first opening through which the first mechanical stop is visible and a second opening through which the second mechanical stop is visible.
16. The compensator of clause 1, wherein:
  the stage comprises first and second arms and an intermediate body connecting the first and second arms; and
  the first and second arms extend from opposing ends of the intermediate body of the stage, thereby forming a U-shape.
17. The compensator of clause 16, wherein the cavity is formed in the intermediate body of the stage.
18. The compensator of clause 16, wherein:
  the first flexure is coupled to the base of the adjustable support and to the first arm of the stage; and
  the second flexure is coupled to the base of the adjustable support and to the second arm of the stage.
19. A method of adjusting one or more characteristics of a radiation beam traveling along an optical path, the method comprising:
  rotating an adjustable support relative to a fixed support slidably coupled thereto such that rotation of the adjustable support relative to the fixed support rotates a first optical wedge coupled to the adjustable support relative to a second optical wedge coupled to the fixed support about a center of the optical path;
  translating a drive block along a drive block path in a first drive block direction, thereby translating the first optical wedge relative to the second optical wedge along a stage path in a first stage direction orthogonal to the optical path and the first drive block direction; and
  translating the drive block along the drive block path in a second drive block direction opposite the first drive block direction, thereby translating the first optical wedge relative to the second optical wedge along the stage path in a second stage direction opposite the first stage direction.
20. The method of clause 19, wherein the rotating the adjustable support relative to the fixed support comprises sliding a rotational alignment bearing surface of the adjustable support against a circumferential guide portion of the fixed support, the circumferential guide portion having a radius extending from a center of the optical path.
21. The method of clause 19, wherein the translating the drive block along the drive block path in the first drive block direction comprises moving a rod coupled to the drive block in the first drive block direction.
22. The method of clause 21, wherein the translating the drive block along the drive block path in the second drive block direction comprises moving the rod coupled to the drive block in the second drive block direction.
23. The method of clause 22, wherein the rod is threaded, and wherein the moving the rod in the first drive block direction and the second drive block direction comprises rotating the rod.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments have been described above, it will be appreciated that the embodiments may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the embodiments and the appended claims in any way.

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the embodiments. Therefore, such adaptations and modifications are intended to be within the meaning and range of equivalents of the disclosed embodiments, based on the teaching and guidance presented herein.

The breadth and scope of the embodiments should not be limited by any of the above-described exemplary embodiments, but should be defined only in accordance with the following claims and their equivalents.

The invention claimed is:

1. A compensator for manipulating a radiation beam traveling along an optical path, the compensator comprising:
   a fixed support holding a first optical wedge; and
   an adjustable support comprising:
      a base coupled to the fixed support;
      a stage holding a second optical wedge, the stage being movable relative to the base and the fixed support, and the stage having a first stage bearing surface and a second stage bearing surface collectively defining in part a cavity;
      first and second flexures movably coupling the stage to the base such that the stage translates along a stage path; and
      a drive block disposed in the cavity, the drive block having a first drive bearing surface and a second drive bearing surface, and the drive block being configured to translate along a drive block path perpendicular to the optical path and perpendicular to the stage path,
      wherein the first drive bearing surface applies a first force to the first stage bearing surface as the drive block translates in a first drive block direction along the drive block path, thereby translating the stage in a first stage direction along the stage path, and
      wherein the second drive bearing surface applies a second force to the second stage bearing surface as the drive block translates in a second drive block direction, opposite the first drive block direction, along the drive block path, thereby translating the stage in a second stage direction, opposite the first stage direction, along the stage path.

2. The compensator of claim 1, wherein:
   the adjustable support further comprises one of a key and a keyway defining the drive block path;
   the drive block further comprises the other of the key and the keyway; and
   an interface between the key and the keyway allows the drive block to translate along the drive block path while preventing rotation of the drive block relative to the base.

3. The compensator of claim 2, wherein:
   the adjustable support further comprises an arm defining a channel;
   the channel forms the keyway; and
   the drive block further comprises a protrusion forming the key that interfaces the keyway.

4. The compensator of claim 1, wherein:
   the base of the adjustable support defines an opening; and
   the adjustable support further comprises a rod movably disposed through the opening, the rod being coupled to the drive block such that movement of the rod in the first drive block direction causes the drive block to translate in the first drive block direction, and movement of the rod in the second drive block direction causes the drive block to translate in the second drive block direction.

5. The compensator of claim 1, further comprising a lock that prevents the stage from moving along the stage path relative to the fixed support.

6. The compensator of claim 5, wherein the lock comprises at least one bolt that fastens the stage to the fixed support and at least one bolt that fastens the drive block to the fixed support.

7. The compensator of claim 1, wherein the fixed support further holds a compensating plate and a half-wave plate.

8. The compensator of claim 1, wherein the adjustable support is configured to space the second optical wedge apart from the first optical wedge, thereby creating an air gap between the first optical wedge and the second optical wedge.

9. The compensator of claim 1, wherein:
the fixed support further comprises at least one rotational alignment bearing surface; and
the adjustable support further comprises at least one rotational alignment bearing surface that slidably interfaces with the at least one rotational alignment bearing surface of the fixed support, thereby constraining any rotation of the adjustable support relative to the fixed support about a center of the optical path.

10. The compensator of claim 9, wherein:
the at least one rotational alignment bearing surface of the fixed support comprises a circumferential guide portion having a radius extending from the center of the optical path; and
the at least one rotational alignment bearing surface of the adjustable support comprises an arm extending from the base of the adjustable support.

11. The compensator of claim 9, further comprising a lock configured to prevent relative rotation between the fixed support and the adjustable support.

12. The compensator of claim 11, wherein the lock comprises at least one bolt that fastens the adjustable support to the fixed support.

13. The compensator of claim 1, further comprising:
a first mechanical stop defining a first terminal position of the stage in the second stage direction along the stage path; and
a second mechanical stop defining a second terminal position of the stage in the first stage direction along the stage path.

14. The compensator of claim 13, wherein:
the first mechanical stop comprises an interface between (a) a first shoulder of the base and (b) a first protrusion of the stage; and
the second mechanical stop comprises an interface between (a) a second shoulder of the base and (b) a second protrusion of the stage.

15. The compensator of claim 13, further comprising a cover coupled to the adjustable support and covering the cavity, wherein the cover defines a first opening through which the first mechanical stop is visible and a second opening through which the second mechanical stop is visible.

16. The compensator of claim 1, wherein:
the stage comprises first and second arms and an intermediate body connecting the first and second arms; and
the first and second arms extend from opposing ends of the intermediate body of the stage, thereby forming a U-shape.

17. The compensator of claim 16, wherein the cavity is formed in the intermediate body of the stage.

18. The compensator of claim 16, wherein:
the first flexure is coupled to the base of the adjustable support and to the first arm of the stage; and
the second flexure is coupled to the base of the adjustable support and to the second arm of the stage.

19. A method of adjusting one or more characteristics of a radiation beam traveling along an optical path, the method comprising:
rotating an adjustable support relative to a fixed support slidably coupled thereto such that rotation of the adjustable support relative to the fixed support rotates a first optical wedge coupled to the adjustable support relative to a second optical wedge coupled to the fixed support about a center of the optical path;
translating a drive block along a drive block path in a first drive block direction, thereby translating the first optical wedge relative to the second optical wedge along a stage path in a first stage direction orthogonal to the optical path and the first drive block direction; and
translating the drive block along the drive block path in a second drive block direction opposite the first drive block direction, thereby translating the first optical wedge relative to the second optical wedge along the stage path in a second stage direction opposite the first stage direction.

20. The method of claim 19, wherein the rotating the adjustable support relative to the fixed support comprises sliding a rotational alignment bearing surface of the adjustable support against a circumferential guide portion of the fixed support, the circumferential guide portion having a radius extending from a center of the optical path.

* * * * *